(12) United States Patent
Yamazaki et al.

(10) Patent No.: US 12,035,061 B2
(45) Date of Patent: Jul. 9, 2024

(54) IMAGING DEVICE AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 307 days.

(21) Appl. No.: 17/422,580

(22) PCT Filed: Jan. 22, 2020

(86) PCT No.: PCT/IB2020/050457
§ 371 (c)(1),
(2) Date: Jul. 13, 2021

(87) PCT Pub. No.: WO2020/157600
PCT Pub. Date: Aug. 6, 2020

(65) Prior Publication Data
US 2022/0103772 A1    Mar. 31, 2022

(30) Foreign Application Priority Data
Jan. 29, 2019   (JP) ................. 2019-013507

(51) Int. Cl.
*H04N 25/75*    (2023.01)
*H01L 27/146*   (2006.01)
*H04N 25/79*    (2023.01)

(52) U.S. Cl.
CPC ....... *H04N 25/75* (2023.01); *H01L 27/14612* (2013.01); *H01L 27/14636* (2013.01); *H04N 25/79* (2023.01)

(58) Field of Classification Search
None
See application file for complete search history.

(56) References Cited

U.S. PATENT DOCUMENTS

| 8,378,391 B2 | 2/2013 | Koyama et al. |
| 9,236,408 B2 | 1/2016 | Yamazaki |

(Continued)

FOREIGN PATENT DOCUMENTS

| CN | 106233465 A | 12/2016 |
| CN | 109155829 A | 1/2019 |

(Continued)

OTHER PUBLICATIONS

JP-2016213298-A; Ikeda Takayuki, Imaging Device and Electronic Apparatus, Dec. 15, 2016; English Translation (Year: 2016).*

(Continued)

*Primary Examiner* — Cynthia Segura
(74) *Attorney, Agent, or Firm* — NIXON PEABODY LLP; Jeffrey L. Costellia

(57) ABSTRACT

An imaging device having a memory function is provided. Alternatively, an imaging device suitable for taking images of a moving object is provided. The imaging device includes a first to third layers; the second layer is provided between the first and the third layer; the first layer includes a photoelectric conversion device; the second layer includes a first and a second circuit; the third layer includes a third and a fourth circuit; the first circuit and the photoelectric conversion device have a function of generating imaging data; the third circuit has a function of reading the imaging data; the second circuit has a function of storing the imaging data read by the third circuit; the fourth circuit has a function of reading the imaging data stored in the second circuit; and the first circuit and the second circuit include a transistor including a metal oxide in a channel formation region.

10 Claims, 15 Drawing Sheets

(56) References Cited

U.S. PATENT DOCUMENTS

| | | | |
|---|---|---|---|
| 9,431,545 | B2 | 8/2016 | Saito et al. |
| 10,015,427 | B2 | 7/2018 | Nakajima et al. |
| 10,333,004 | B2 | 6/2019 | Kimura et al. |
| 10,375,334 | B2 | 8/2019 | Nakajima et al. |
| 10,658,519 | B2 | 5/2020 | Kimura et al. |
| 10,659,707 | B2 | 5/2020 | Oka et al. |
| 11,082,651 | B2 | 8/2021 | Oka et al. |
| 11,211,461 | B2 | 12/2021 | Yamazaki et al. |
| 11,899,478 | B2 * | 2/2024 | Sato .................... H01L 27/1207 |
| 2003/0052324 | A1 | 3/2003 | Kimura |
| 2011/0204371 | A1 | 8/2011 | Kozuma et al. |
| 2014/0217486 | A1 | 8/2014 | Akiyama |
| 2017/0155865 | A1 | 6/2017 | Nakajima et al. |
| 2017/0221943 | A1 * | 8/2017 | Yamazaki ........... H01L 27/1225 |
| 2018/0054576 | A1 * | 2/2018 | Otaka .................... H04N 25/59 |
| 2019/0297287 | A1 | 9/2019 | Oka et al. |
| 2020/0227564 | A1 | 7/2020 | Kimura et al. |
| 2020/0296309 | A1 | 9/2020 | Oka et al. |
| 2020/0412929 | A1 * | 12/2020 | Yonemochi ............ H04N 23/73 |
| 2021/0112213 | A1 | 4/2021 | Oka et al. |
| 2021/0314513 | A1 * | 10/2021 | Ishii .................... H04N 25/704 |
| 2022/0149100 | A1 * | 5/2022 | Ikeda ................ H01L 27/14601 |
| 2022/0352279 | A1 * | 11/2022 | Kobayashi ............... G09G 3/20 |
| 2023/0187467 | A1 * | 6/2023 | Or-Bach ............. H01L 27/1469 257/444 |
| 2023/0238412 | A1 * | 7/2023 | Ikeda ................ H01L 27/14625 257/43 |

FOREIGN PATENT DOCUMENTS

| | | | | |
|---|---|---|---|---|
| EP | 3468169 | A | 4/2019 | |
| EP | 3726830 | A | 10/2020 | |
| EP | 3748955 | A | 12/2020 | |
| JP | 2011-119711 | A | 6/2011 | |
| JP | 2016-213298 | A | 12/2016 | |
| JP | 2016213298 | A * | 12/2016 | ....... H01L 27/14603 |
| JP | 2017-175129 | A | 9/2017 | |
| KR | 2016-0144358 | A | 12/2016 | |
| KR | 2019-0015201 | A | 2/2019 | |
| WO | WO-2015/159728 | | 10/2015 | |
| WO | WO-2017/209221 | | 12/2017 | |
| WO | WO-2020122010 | A1 * | 6/2020 | ....... H01L 27/14603 |
| WO | WO-2021200174 | A1 * | 10/2021 | ....... H01L 27/14612 |

OTHER PUBLICATIONS

International Search Report (Application No. PCT/IB2020/050457) dated Mar. 24, 2020.

Written Opinion (Application No. PCT/IB2020/050457) dated Mar. 24, 2020.

* cited by examiner

FIG. 3A

| Line[1] | Rn-1 | | En | | | Rn | En+1 | | |
|---|---|---|---|---|---|---|---|---|---|
| Line[2] | En-1 | Rn-1 | | | En | | Rn | En+1 | |
| Line[3] | En-1 | | Rn-1 | | En | | | Rn | En+1 |
| ⋮ | | | | | | | | | |
| Line[M] | | En-1 | | | Rn-1 | En | | | Rn |

FIG. 3B

| Line[1] | En | Rn | | | En+1 |
|---|---|---|---|---|---|
| Line[2] | En | | Rn | | En+1 |
| Line[3] | En | | | Rn | En+1 |
| ⋮ | | | | | |
| Line[M] | En | | | Rn | En+1 |

IMAGING DEVICE AND ELECTRONIC DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

REFERENCE

[Patent Document]
[Patent Document 1] Japanese Published Patent Application No. 2011-119711

SUMMARY OF THE INVENTION

Problems to be Solved by the Invention

An imaging device is used for various applications, and higher speed and higher performance are desired for imaging operation. For example, it is preferable that data can be retained in one frame unit in order to perform high-speed continuous shooting, analysis of imaging data, and the like.

An object of one embodiment of the present invention is to provide an imaging device having a memory function. Another object is to provide an imaging device suitable for taking images of a moving object. An object is to provide an imaging device with low power consumption. Another object is to provide an imaging device with high reliability. Another object is to provide a novel imaging device. Another object is to provide a method for operating the above imaging device. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to an imaging device having a memory function.

One embodiment of the present invention is an imaging device including a first layer, a second layer, and a third layer; the second layer is provided between the first layer and the third layer; the first layer includes a photoelectric conversion device; the second layer includes a first circuit and a second circuit; the third layer includes a third circuit and a fourth circuit; the first circuit and the photoelectric conversion device have a function of generating imaging data; the third circuit has a function of reading the imaging data; the second circuit has a function of storing the imaging data read by the third circuit; the fourth circuit has a function of reading the imaging data stored in the second circuit; and the first circuit and the second circuit include a transistor including a metal oxide in a channel formation region.

The first circuit includes a first transistor, a second transistor, a third transistor, a fourth transistor, and a first capacitor; one electrode of the photoelectric conversion device is electrically connected to one of a source and a drain of the first transistor; the other of the source and the drain of the first transistor is electrically connected to one of a source and a drain of the second transistor; the one of the source and the drain of the second transistor is electrically connected to one electrode of the first capacitor; the one electrode of the first capacitor is electrically connected to a gate of the third transistor; one of a source and a drain of the third transistor is electrically connected to one of a source and a drain of the fourth transistor; and the other of the source and the drain of the fourth transistor is electrically connected to the third circuit.

The second circuit includes a fifth transistor and a second capacitor; one of a source and a drain of the fifth transistor is electrically connected to one electrode of the second capacitor; the other of the source and the drain of the fifth transistor is electrically connected to the third circuit; and the other of the source and the drain of the fifth transistor is electrically connected to the fourth circuit.

The third circuit can include an A/D converter, and the fourth circuit can include a sense amplifier.

The first layer and the third layer can include single crystal silicon.

It is preferable that the metal oxide include In, Zn, and M (M is Al, Ti, Ga, Ge, Sn, Y, Zr, La, Ce, Nd, or Hf).

Effect of the Invention

With the use of one embodiment of the present invention, an imaging device having a memory function can be provided. Alternatively, an imaging device suitable for taking images of a moving object can be provided. An imaging device with low power consumption can be provided. Alternatively, an imaging device with high reliability can be provided. Alternatively, a novel imaging device can be provided. Alternatively, a method for operating the above imaging device can be provided. Alternatively, a novel semiconductor device or the like can be provided.

BRIEF DESCRIPTION OF THE DRAWINGS

FIG. 3A is a diagram illustrating a rolling shutter mode, and FIG. 3B is a diagram illustrating a global shutter mode.

MODE FOR CARRYING OUT THE INVENTION

Figure 1:
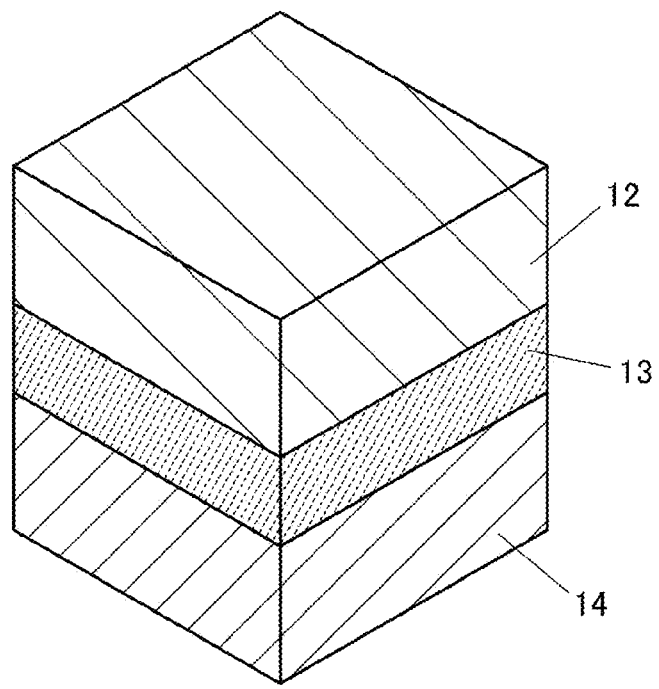
FIG. 1 is a diagram illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through a plurality of conductors; in this specification, even such a structure is included in direct connection.

Embodiment 1

In this embodiment, an imaging device of one embodiment of the present invention will be described with reference to drawings.

One embodiment of the present invention is an imaging device having a memory function. Imaging data is temporarily stored in a memory circuit, whereby imaging data can be continuously obtained at high speed. In addition, the imaging data can be read from the memory circuit at high speed, and data analysis or the like can also be performed at high speed.

Furthermore, when a pixel circuit that can take images with a global shutter mode is used, undistorted images can be obtained even if the object is moving.

In one embodiment of the present invention, a transistor including a metal oxide in its channel formation region (hereinafter, an OS transistor) is used for a circuit included in a pixel. An OS transistor can be formed over a silicon substrate, in which case a bonding step can be skipped.

Imaging Device

FIG. 1 is a diagram illustrating an imaging device of one embodiment of the present invention. The imaging device includes a layer 12, a layer 13, and a layer 14. The layer 13 is provided between the layer 12 and the layer 14, and the layer 12, the layer 13, and the layer 14 have a region overlapping with each other.

The layer 12 includes a photoelectric conversion device (also referred to as a photoelectric conversion element). As the photoelectric conversion device, a photodiode can be used. As the photodiode, a pn-junction photodiode using single crystal silicon for a photoelectric conversion portion, a pin photodiode using amorphous silicon, polycrystalline silicon, or microcrystalline silicon for a photoelectric conversion layer, or the like can be used, for example. Alternatively, a material such as a compound semiconductor, selenium, a selenium compound, or the like may be used for the photoelectric conversion layer. In this embodiment, an example will be described in which the pn-junction photodiode using single crystal silicon is used as the photoelectric conversion device.

A transistor included in a pixel circuit or the like and a transistor included in a memory circuit or the like are provided in the layer 13. An OS transistor is preferably used as the transistor. A characteristic of an OS transistor is an extremely low off-state current, which enables long-term data retention in a pixel circuit, for example; the OS transistor is suitable as a component of the pixel circuit. The memory circuit can store digital data output from a first read circuit to be described next.

A transistor included in the first read circuit or the like and a transistor included in a second read circuit or the like are provided in the layer 14. The first read circuit can include, for example, an A/D converter for converting analog data output from the pixel circuit into digital data or the like. The second read circuit can include, for example, a sense amplifier for reading data stored in the memory circuit or the like.

Pixel Circuit

Figure 2A:
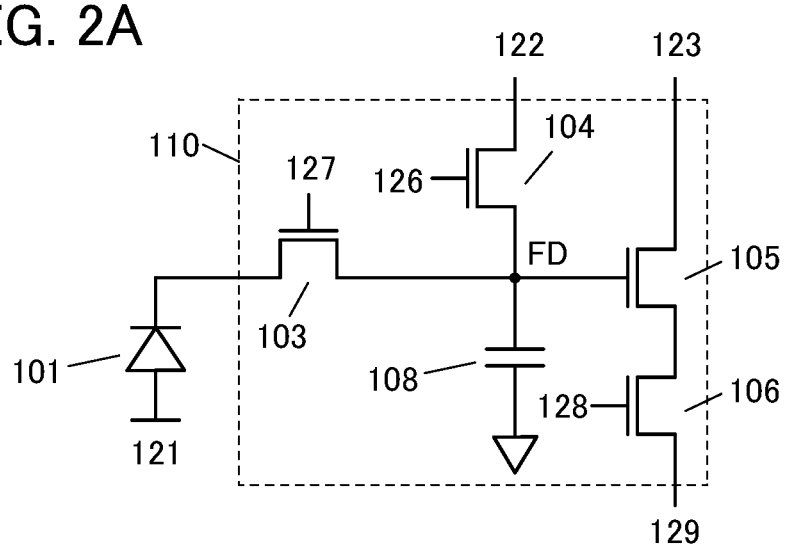
FIG. 2A and FIG. 2B are diagrams illustrating pixel circuits.

FIG. 2A is a diagram illustrating an example of the pixel circuit. The pixel circuit includes a photoelectric conversion device 101 included in the layer 12 and a circuit 110 included in the layer 13. The circuit 110 can include a transistor 103, a transistor 104, a transistor 105, a transistor 106, and a capacitor 108. Note that the capacitor 108 is not necessarily provided.

One electrode (cathode) of the photoelectric conversion device 101 is electrically connected to one of a source and a drain of the transistor 103. The other of the source and the drain of the transistor 103 is electrically connected to one of a source and a drain of the transistor 104. The one of the source and the drain of the transistor 104 is electrically connected to one electrode of the capacitor 108. The one electrode of the capacitor 108 is electrically connected to a gate of the transistor 105. One of a source and a drain of the transistor 105 is electrically connected to one of a source and a drain of the transistor 106.

Here, a wiring that connects the other of the source and the drain of the transistor 103, the one electrode of the capacitor 108, and the gate of the transistor 105 is a node FD. The node FD can function as a charge accumulation portion.

The other electrode (anode) of the photoelectric conversion device 101 is electrically connected to a wiring 121. A gate of the transistor 103 is electrically connected to a wiring 127. The other of the source and the drain of the transistor 104 is electrically connected to a wiring 122. The other of the source and the drain of the transistor 105 is electrically connected to a wiring 123. A gate of the transistor 104 is electrically connected to a wiring 126. A gate of the transistor 106 is electrically connected to a wiring 128. The other electrode of the capacitor 108 is electrically connected to a reference potential line such as a GND wiring, for example. The other of the source and the drain of the transistor 106 is electrically connected to a wiring 129.

The wirings 127, 126, and 128 can have functions of signal lines that control the conduction of the transistors. The wiring 129 can have a function of an output line.

The wirings 121, 122, and 123 can have functions of power supply lines. The structure illustrated in FIG. 2A is a structure in which the cathode side of the photoelectric conversion device 101 is electrically connected to the transistor 103 and the node FD is reset to a high potential in the operation; accordingly, the wiring 122 is set to a high potential (a potential higher than that of the wiring 121).

Figure 2B:
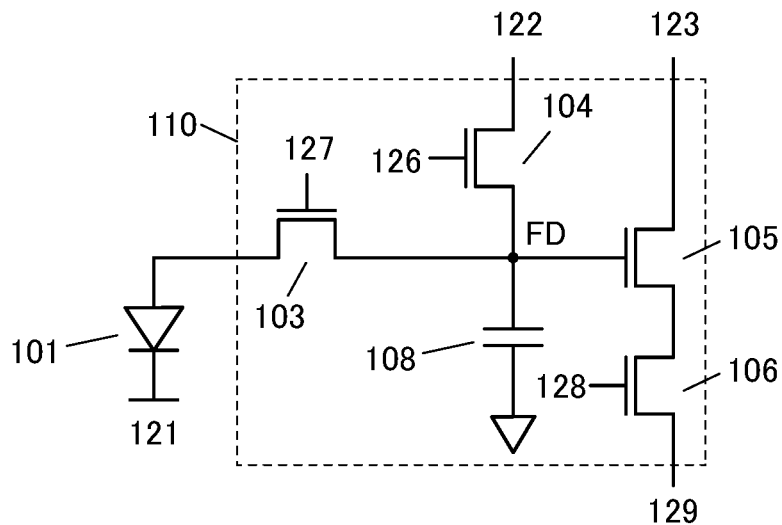

Although the cathode of the photoelectric conversion device 101 is electrically connected to the node FD in FIG. 2A, the anode side of the photoelectric conversion device 101 may be electrically connected to the one of the source and the drain of the transistor 103 as illustrated in FIG. 2B. Since the node FD is reset to a low potential in the operation in the structure, the wiring 122 is set to a low potential (a potential lower than that of the wiring 121).

The transistor 103 has a function of controlling the potential of the node FD. The transistor 104 has a function of resetting the potential of the node FD. The transistor 105 functions as a source follower circuit, and can output the potential of the node FD as image data to the wiring 129. The transistor 106 has a function of selecting a pixel to which the image data is output.

It is preferable to use OS transistors as the transistor 103 and the transistor 104. The OS transistor has a feature of extremely low off-state current. When OS transistors are used as the transistors 103 and 104, the charge retention period at the node FD can be prolonged greatly. Therefore, a global shutter mode in which charge accumulation operation is performed in all the pixels at the same time can be used without complicating the circuit structure and operation method.

Operation Mode of Imaging Device

FIG. 3A is a schematic view of an operation method with a rolling shutter mode, and FIG. 3B is a schematic view of the global shutter mode. Note that En denotes exposure (accumulation operation) in the n-th column (n is a natural number), and Rn denotes reading operation in the n-th column. FIG. 3A and FIG. 3B illustrate operation from the first row to the M-th row (M is a natural number).

The rolling shutter mode is an operation method in which the exposure and data reading are performed sequentially and a reading period of a row overlaps with an exposure period of another row. The reading operation is performed right after the exposure, so that images can be taken even with a circuit structure having a relatively short data retention period. However, an image of one frame is composed of data that does not have simultaneity of imaging; therefore, distortion is caused in an image when taking an image of a moving object.

On the other hand, the global shutter mode is an operation method in which exposure is performed on all the pixels at the same time, data is retained in each pixel, and data reading is performed row by row. Thus, an undistorted image can be obtained even when an image of a moving object is taken.

When a transistor having a relatively high off-state current, such as a transistor using Si in its channel formation region (hereinafter, Si transistor), is used in a pixel circuit, a data potential can easily leak from a charge accumulation portion; thus, the rolling shutter mode is mainly used. In order to achieve the global shutter mode using a Si transistor, a dedicated memory circuit or the like needs to be provided additionally, and more complex operation has to be performed at high speed. On the other hand, when an OS transistor is used in a pixel circuit, the data potential hardly leaks from the charge accumulation portion; thus, the global shutter mode can be easily achieved. Note that the imaging device of one embodiment of the present invention can also operate with the rolling shutter mode.

Note that an OS transistor and a Si transistor may be freely used in combination as the transistors included in the pixel circuit. Furthermore, all the transistors may be either OS transistors or Si transistors. Examples of the Si transistor include a transistor containing amorphous silicon and a transistor containing crystalline silicon (typically, low-temperature polysilicon, single crystal silicon, or the like).

Memory Circuit

Figure 2C:
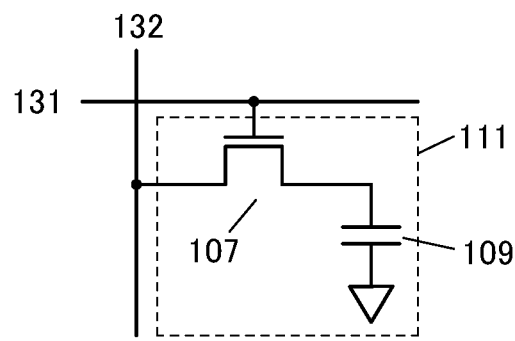
FIG. 2C is a diagram illustrating a memory circuit.

FIG. 2C is a diagram illustrating an example of a cell of the memory circuit included in the layer 13. A cell 111 includes a transistor 107 and a capacitor 109. One of a source and a drain of the transistor 107 is electrically connected to one electrode of the capacitor 109. The other of the source and the drain of the transistor 107 is electrically connected to a wiring 132. A gate of the transistor 107 is electrically connected to the wiring 132. Note that a cell having another structure can be used.

A wiring 131 can have a function of a word line. The wiring 132 can have a function of a bit line. When the transistor 107 is turned on, data can be written from the wiring 132 to the capacitor 109. Alternatively, when the transistor 107 is turned on, data can be read from the capacitor 109 to the wiring 132.

An OS transistor is preferably used as the transistor 107. As described above, since the off-state current of the OS transistor is extremely low, charge accumulated in the capacitor 109 can be retained for a long time. Consequently, a refresh interval can be increased, and thus power consumption can be reduced. In addition, the transistor can be substantially used as a nonvolatile memory. The details of the memory circuit will be described in the following embodiments later.

Operation of Pixel Circuit

Figure 4A:
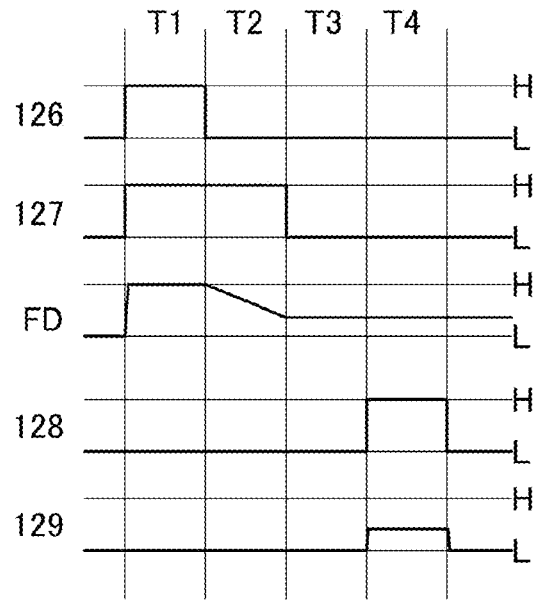
FIG. 4A and FIG. 4B are timing charts illustrating the operation of a pixel circuit.

Next, an example of the operation of the pixel circuit illustrated in FIG. 2A will be described with reference to the timing chart in FIG. 4A. Note that in the description of the timing chart in this specification, a high potential is denoted by "H" and a low potential is denoted by "L". The wiring 121 is always supplied with "L", and the wirings 122 and 123 are always supplied with "H".

In a period T1, when the potential of the wiring 126 is set to "H", the potential of the wiring 127 is set to "H", and the potential of the wiring 128 is set to "L", the transistors 103 and 104 are turned on and the node FD is supplied with the potential "H" of the wiring 123 (reset operation) (see FIG. 2A).

In a period T2, the potential of the wiring 126 is set to "L", the potential of the wiring 127 is set to "H", and the potential of the wiring 128 is set to "L", whereby the transistor 104 is turned off, and supply of the reset potential is stopped. Furthermore, the potential of the node FD is decreased in accordance with the operation of the photoelectric conversion device 101 (accumulation operation).

In a period T3, the potential of the wiring 126 is set to "L", the potential of the wiring 127 is set to "L", and the potential of the wiring 128 is set to "L", whereby the transistor 103 is turned off, and the potential of the node FD is fixed and retained (retention operation). At this time, OS transistors, whose off-state current is low, are used as the transistor 103 and the transistor 104, which are connected to the node FD, whereby unnecessary charge leakage from the node FD can be inhibited and the data retention time can be extended.

In a period T4, the potential of the wiring 126 is set to "L", the potential of the wiring 127 is set to "L", and the potential of the wiring 128 is set to "H", whereby the transistor 106 is turned on, and the potential of the node FD is read out to the wiring 129 by source follower operation of the transistor 105 (reading operation).

The above is an example of the operation of the pixel circuit illustrated in FIG. 2A.

Figure 4B:
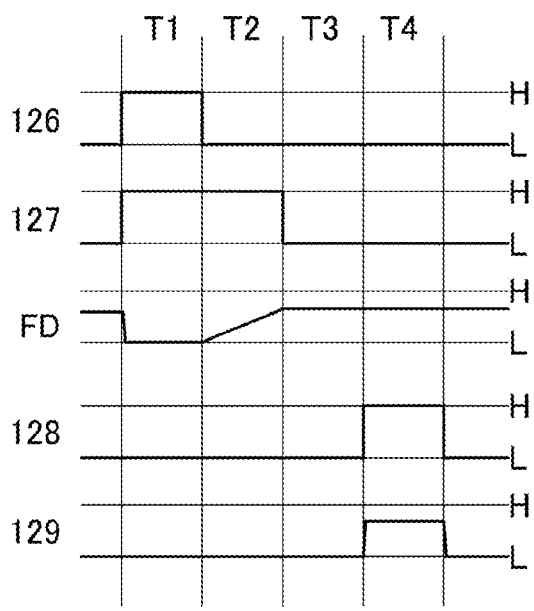

The pixel circuit illustrated in FIG. 2B can operate according to the timing chart in FIG. 4B. The wirings 121 and 123 are always supplied with "H", and the wiring 122 is always supplied with "L". The fundamental operation is similar to that described above with the timing chart in FIG. 2A.

Figure 5A:
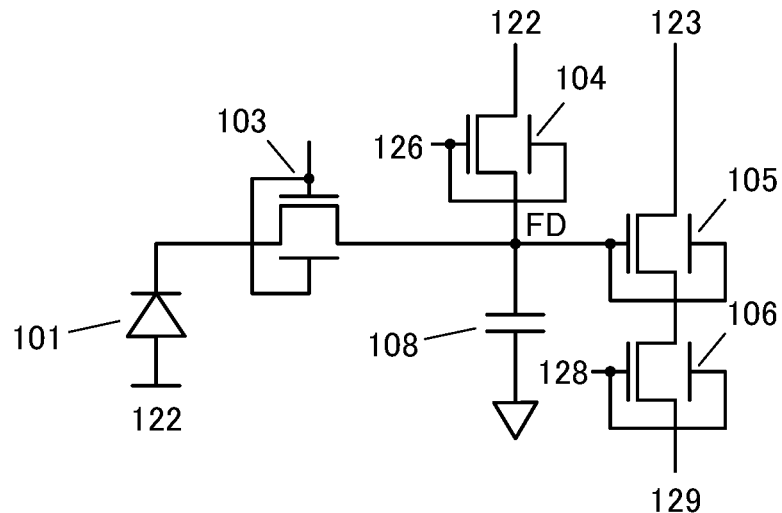
FIG. 5A and FIG. 5B are diagrams illustrating pixel circuits.
Figure 5B:
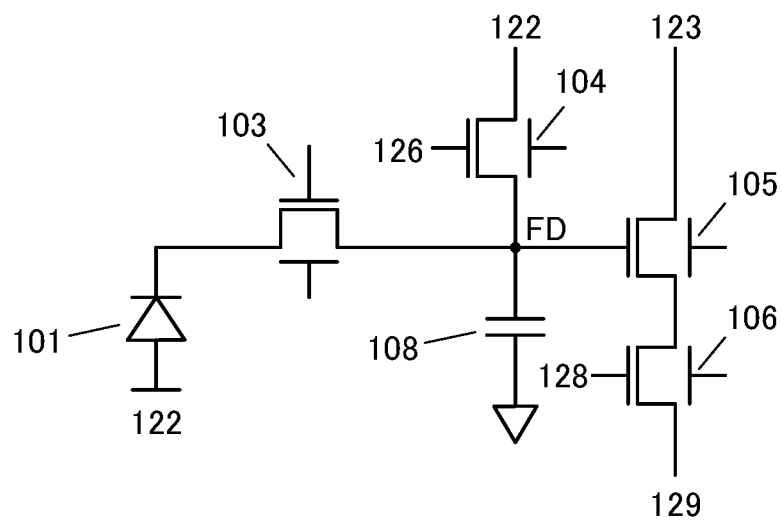

In one embodiment of the present invention, as illustrated in examples of FIG. 5A and FIG. 5B, a structure in which transistors are provided with back gates may be employed. FIG. 5A illustrates a structure in which the back gates are electrically connected to front gates, which has an effect of increasing on-state current. FIG. 5B illustrates a structure in which the back gates are electrically connected to wirings capable of supplying a constant potential, which enables the threshold voltage of the transistors to be controlled.

Moreover, a structure which enables each transistor to perform appropriate operation, for example, a combined structure of FIG. 5A and FIG. 5B, may be employed. The pixel circuit may include a transistor not provided with a back gate.

Structure Example of Imaging Device

Figure 6A:
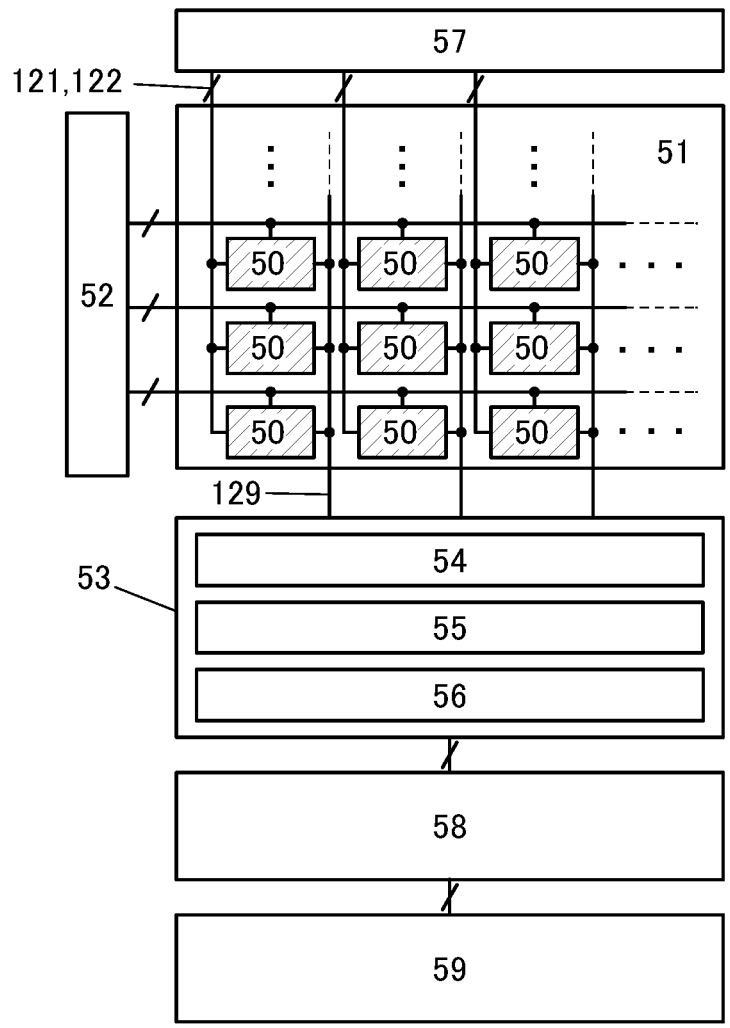
FIG. 6A to FIG. 6C are block diagrams illustrating an imaging device.

FIG. 6A is a block diagram illustrating the imaging device of one embodiment of the present invention. The imaging device includes a pixel array 51 including pixel circuits 50 arranged in a matrix, a circuit 52 having a function of selecting a row of the pixel array 51 (row driver), a circuit 53 having a function of reading data from the pixel circuit 50, a circuit 57 for supplying a reset potential and a power supply potential, a circuit 58 for storing output data of the circuit 53, and a circuit 59 having a function of reading data from the circuit 58.

The circuit 53 can include a circuit 54 having a function of selecting a column of the pixel array 51 (column driver), a circuit 55 for performing correlated-double-sampling treatment on output data from the pixel circuits 50 (CDS circuit), a circuit 56 having a function of converting analog data output from the circuit 55 into digital data (A/D converter), and the like. A shift register circuit or a decoder circuit can be used as the circuits 52 and 54.

Figure 6B:
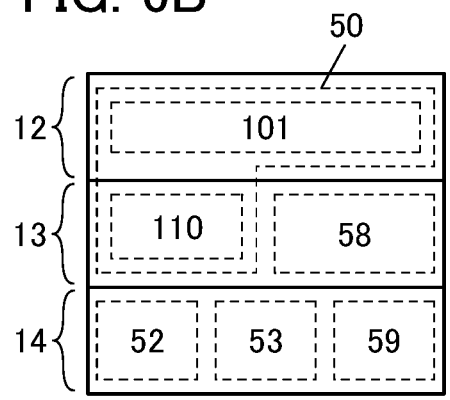
Figure 6C:
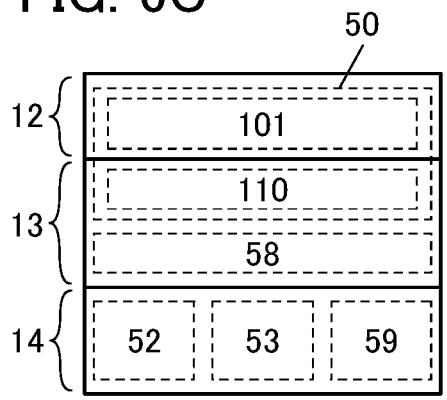

FIG. 6B and FIG. 6C are conceptual diagrams illustrating the arrangement of each of the above circuits and the circuits illustrated in FIG. 2A, FIG. 2B, and FIG. 2(C) in the stacked-layer structure of the imaging device illustrated in FIG. 1.

The photoelectric conversion device 101 is provided in the layer 12, and is electrically connected to the circuit 110 provided in the layer 13, whereby the pixel circuit 50 is formed. In addition, the circuit 58 is provided in the layer 13.

The circuit 110 and the circuit 58 can be arranged side by side in the horizontal direction as illustrated in FIG. 6B. The circuit 110 and the circuit 58 are formed with OS transistors, so that the circuit 110 and the circuit 58 can be fabricated through the same process.

Alternatively, the circuit 110 and the circuit 58 may be stacked in a vertical direction as illustrated in FIG. 6C. Since an OS transistor can be formed in a thin film, the transistor can be stacked easily. By stacking the circuit 110 and the circuit 58, the pixel circuit 50 and the cell 111 can be arranged at high density, and resolution and storage capacity can be improved. The cell 111 is not limited to a single layer, and may be a stack of a plurality of layers.

The circuit 52, the circuit 53, the circuit 59, and the like can be provided in the layer 14. These circuits are desired to be operated at high speed, and thus are preferably formed with Si transistors. That is, the layer 14 preferably includes a single crystal silicon substrate. Note that the circuit 52 may be formed with an OS transistor. In this case, the circuit 52 is provided in the layer 12.

Furthermore, without limitation to the above structure, some of the transistors included in each of the circuit 52, the circuit 53, and the circuit 59 may be formed with the OS transistors provided in the layer 13. Alternatively, some of the transistors included in each of the circuit 110 and the circuit 58 may be formed with the Si transistors provided in the layer 14.

With the imaging device having the above structure, imaging and data processing can be performed at high speed. Furthermore, a circuit including an OS transistor can be formed over a circuit including a Si transistor to overlap with each other, so that the imaging device can be small. Moreover, a bonding step can be skipped and manufacturing cost can be reduced.

This embodiment can be implemented in combination with any of the structures described in the other embodiments and the like, as appropriate.

Embodiment 2

In this embodiment, details of structure examples and the like of the imaging device of one embodiment of the present invention will be described.

Figure 7A:
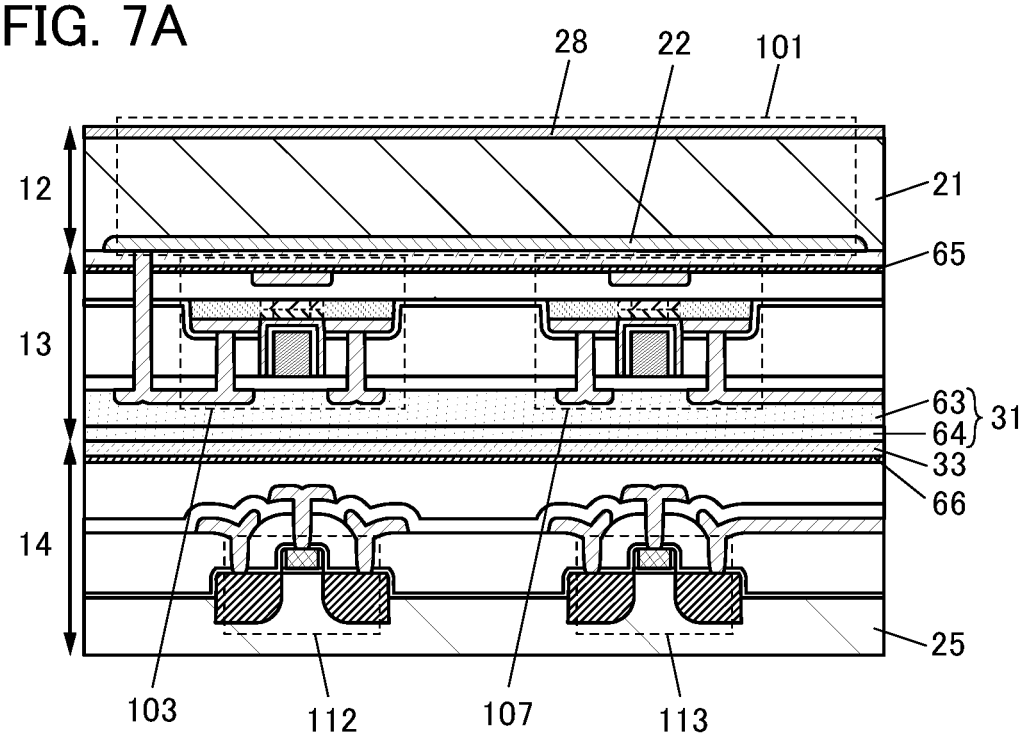
FIG. 7A and FIG. 7B are cross-sectional views illustrating structures of an imaging device.

FIG. 7A is a diagram illustrating an example of a cross-section including a pixel region. The structure can be fabricated in the following manner: the layer 13 is fabricated over the layer 12, and the layer 14 formed separately is bonded to the layer 13. Note that the electrical connection portion between the layer 13 and the layer 14 is omitted.

In the layer 12, a pn-junction photodiode including a region 22 that has the n-type conductivity, a region that has the p-type conductivity (single crystal silicon substrate 21), and a region 28 that has the p$^+$-type conductivity is provided as the photoelectric conversion device 101.

OS transistors are provided in the layer 13. In FIG. 7A, taking the circuit structures illustrated in FIG. 2A, FIG. 2B, and FIG. 2(C) as an example, the transistor 103 and the transistor 107 are illustrated.

A silicon substrate 25 including Si transistors and the like are provided in the layer 14. FIG. 7A illustrates a transistor 112 included in the circuit 53 and a transistor 113 included in the circuit 59.

Insulating layers 65 and 66 are provided between a region where the OS transistors are formed and regions where Si devices (e.g., the photoelectric conversion device 101 or the Si transistors) are formed. The insulating layers 65 and 66 have a function of preventing diffusion of hydrogen. Dangling bonds of silicon are terminated by hydrogen in the insulating layer provided in the vicinity of the photoelectric conversion device 101, for example. Meanwhile, hydrogen in the insulating layer provided in the vicinity of channel formation regions of the transistors 103 and 107 is one of the factors of generating carriers in an oxide semiconductor layer.

The insulating layers 65 and 66 confine hydrogen to one layer, which can improve the reliability of the Si device. Furthermore, diffusion of hydrogen from the one layer to the other layer is inhibited, so that the reliability of the transistors 103 and 107 can also be improved.

As the insulating layers 65 and 66, for example, aluminum oxide, aluminum oxynitride, gallium oxide, gallium oxynitride, yttrium oxide, yttrium oxynitride, hafnium oxide, hafnium oxynitride, yttria-stabilized zirconia (YSZ) can be used.

An insulating layer 31 is provided on the layer 13 side of a junction region between the layer 13 and the layer 14. An insulating layer 33 is provided on the layer 14 side. The insulating layer 31 and the insulating layer 33 are insulating layers contributing to the bonding.

Note that FIG. 7A illustrates an example in which the insulating layer 31 has two layers, an insulating layer 63 and an insulating layer 64. For the insulating layer 63, an organic film such as an acrylic resin or polyimide can be used. For the insulating layer 33 and the insulating layer 64, an inorganic film such as a silicon oxide film can be used.

Figure 7B:
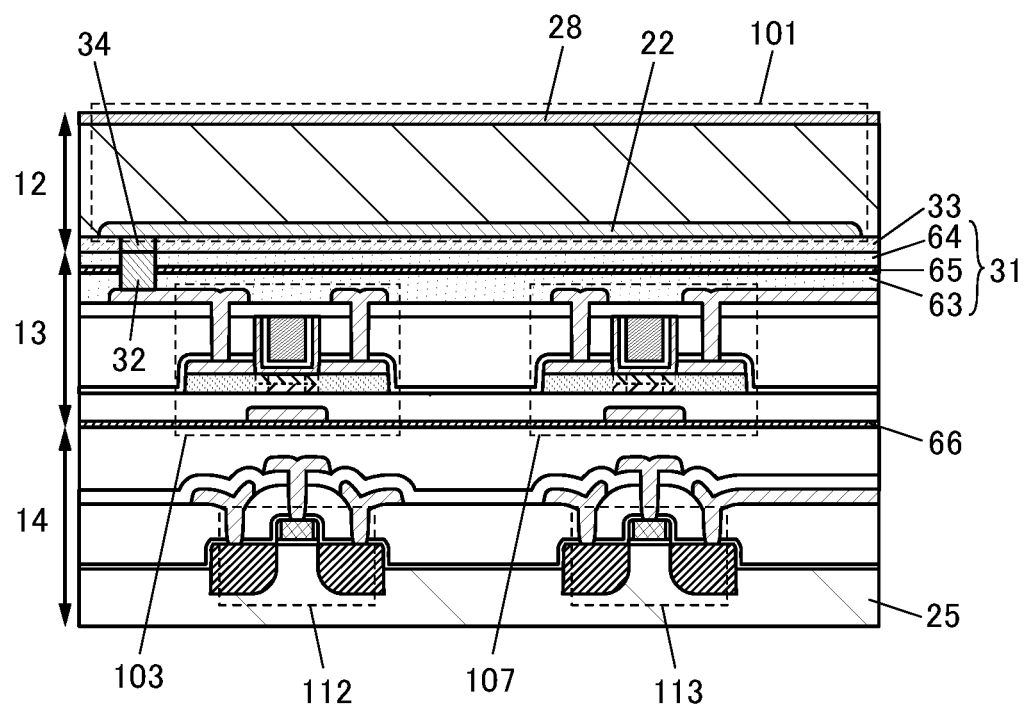

FIG. 7B illustrates a structure example different from that in FIG. 7A. The structure can be fabricated in the following manner: the layer 13 is fabricated over the layer 14, and the layer 12 formed separately is bonded to the layer 13. Note that the electrical connection portion between the layer 13 and the layer 14 is omitted.

In this case, the insulating layer 33 and a conductive layer 34 are provided on the layer 12 side of a junction region between the layer 12 and the layer 13. The insulating layer 31 and a conductive layer 32 are provided on the layer 13 side. Here, an example is illustrated in which the insulating layer 31 has three layers, the insulating layer 63, an insulating layer 65, and the insulating layer 64. The insulating layer 65 may be provided at another position as long as the above effect can be obtained. For example, the insulating layer 63 and the insulating layer 65 may be interchanged.

The conductive layer 34 and the conductive layer 32 are bonded to each other, whereby electrical connection can be obtained.

Figure 8A:
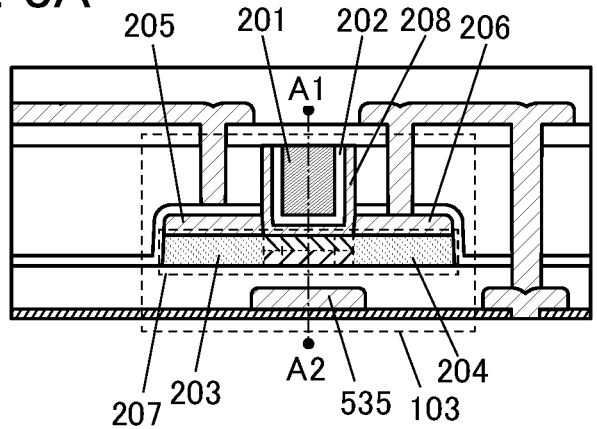
FIG. 8A to FIG. 8D are diagrams illustrating a transistor.

The details of an OS transistor are illustrated in FIG. 8A. The OS transistor illustrated in FIG. 8A has a self-aligned structure in which an insulating layer is provided over a stacked layer of an oxide semiconductor layer and a conductive layer and a groove reaching the semiconductor layer is provided, so that a source electrode 205 and a drain electrode 206 are formed.

The OS transistor can include a gate electrode 201 and a gate insulating film 202 in addition to a channel formation region, a source region 203, and a drain region 204, which are formed in an oxide semiconductor layer 207. At least the gate insulating film 202 and the gate electrode 201 are provided in the groove. The groove may further be provided with an oxide semiconductor layer 208.

Figure 8B:
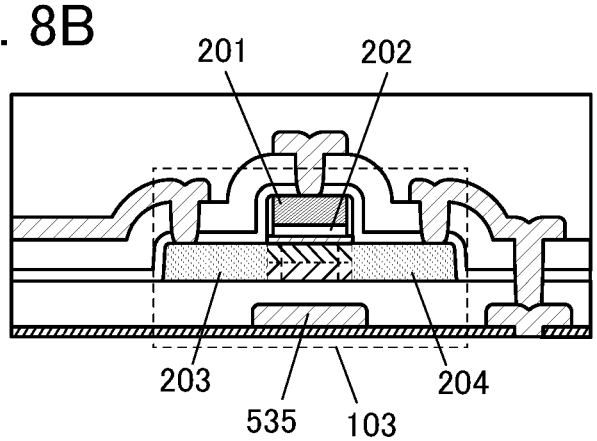

As illustrated in FIG. 8B, the OS transistor may have a self-aligned structure in which the source region 203 and the drain region 204 are formed in a semiconductor layer with the gate electrode 201 as a mask.

Figure 8C:
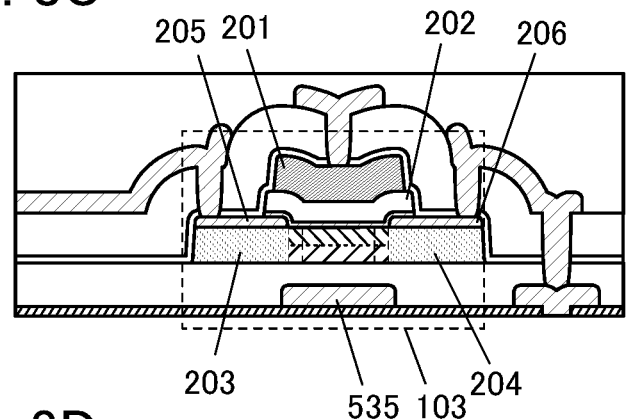

Alternatively, as illustrated in FIG. 8C, the OS transistor may be a non-self-aligned top-gate transistor including a region where the source electrode 205 or the drain electrode 206 and the gate electrode 201 overlap with each other.

Figure 8D:
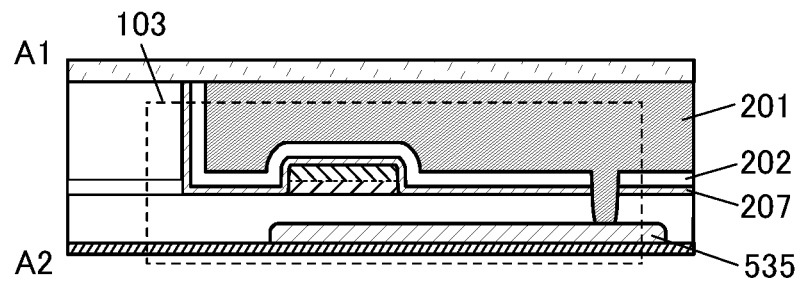

Although the transistors 103, 105, and 106 are illustrated to have structures in which a back gate 535 is included, structures in which a back gate is not included may be employed. As illustrated in the cross-sectional view of the transistor in the channel width direction in FIG. 8D, the back gate 535 may be electrically connected to a front gate of a transistor, which is provided to face the back gate. Although FIG. 8D illustrates an A1-A2 cross section of the transistor 103 in FIG. 8A, the front gate and the back gate 535 may be electrically connected to each other similarly in a transistor with another structure. The back gate 535 may be supplied with a fixed potential that is different from that supplied to the front gate.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAAC-OS, a CAC-OS, or the like described later can be used. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yA/μm (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in Si transistors, are less likely to occur in OS transistors.

A semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium). The In-M-Zn-based oxide can be formed by, for example, a sputtering method, an ALD (Atomic Layer Deposition) method, an MOCVD (Metal Organic Chemical Vapor Deposition) method, or the like.

In the case where an In-M-Zn oxide is deposited by a sputtering method, it is preferable that the atomic ratio of metal elements of a sputtering target satisfy In M and Zn M. The atomic ratio of metal elements of such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the deposited semiconductor layer varies by ±40% from the above atomic ratios of metal elements contained in the sputtering targets.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

However, the composition is not limited to those, and a material having the appropriate composition is used depending on required semiconductor characteristics and electrical characteristics of the transistor (field-effect mobility, threshold voltage, or the like). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to be appropriate.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (concentration measured by secondary ion mass spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to an oxide semiconductor, in which case the off-state current of the transistor might be increased. Thus, the concentration of alkali metal or alkaline earth metal (concentration measured by secondary ion mass spectrometry) in the semiconductor layer is set to lower than or equal to $1\times10^{18}$ atoms/$cm^3$, preferably lower than or equal to $2\times10^{16}$ atoms/$cm^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the concentration of nitrogen in the semiconductor layer (concentration measured by secondary ion mass spectrometry) is preferably set to lower than or equal to $5\times10^{18}$ atoms/$cm^3$.

In addition, when hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming a state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$. When an oxide semiconductor with sufficiently reduced impurities such as hydrogen is used for a channel formation region of a transistor, stable electrical characteristics can be given.

Oxide semiconductors (metal oxides) can be classified into a single crystal oxide semiconductor and a non-single-crystal oxide semiconductor. Examples of the non-single-crystal oxide semiconductors include a CAAC-OS (C-Axis Aligned Crystalline Oxide Semiconductor), a polycrystalline oxide semiconductor, an nc-OS (nanocrystalline Oxide Semiconductor), an amorphous-like oxide semiconductor (a-like OS), and an amorphous oxide semiconductor. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of a region having an amorphous structure, a region having a microcrystalline structure, a region having a polycrystalline structure, a region of the CAAC-OS, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

The CAC-OS is, for example, a composition of a material in which elements included in an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state where one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that an oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite oxide semiconductor having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

The nanocrystal is basically a hexagon but is not always a regular hexagon and is a non-regular hexagon in some cases. Furthermore, a pentagonal or heptagonal lattice arrangement, for example, is included in distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal element, and the like. A crystal structure in which a clear crystal grain boundary (grain boundary) is observed is what is called a polycrystal structure. It is highly probable that the crystal grain boundary becomes a recombination center and traps carriers and thus decreases the on-state current or field-effect mobility of a transistor. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

Meanwhile, the CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary cannot sometimes be observed between the region where $GaO_{X3}$ is a main component and the region where $In_{X2}Zn_{Y2}O_{Z2}$ or $InO_{X1}$ is a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under a condition where a substrate is not heated intentionally, for example. In the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In an electron diffraction pattern of the CAC-OS which is obtained by irradiation with an electron beam with a probe diameter of 1 nm (also referred to as a nanobeam electron beam), a ring-like region with high luminance (a ring region) and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region containing $GaO_{X3}$ as a main component and the region containing $In_{X2}Zn_{Y2}O_{Z2}$ or $InO_{X1}$ as a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other and form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility ($\mu$) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be inhibited and favorable switching operation can be achieved.

Accordingly, when a CAC-OS is used in a semiconductor device, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility ($\mu$) can be achieved.

A semiconductor device using a CAC-OS has high reliability. Thus, the CAC-OS is suitably used as a material in a variety of semiconductor devices.

Next, taking the structure in FIG. 7B as an example, the bonding technique will be described.

The insulating layer 33 and the conductive layer 34 are provided in the layer 12. The conductive layer 34 includes a region that is embedded in and penetrates the insulating layer 33. The conductive layer 34 is electrically connected to the region 22. Furthermore, surfaces of the insulating layer 33 and the conductive layer 34 are planarized to be level with each other.

The insulating layer 31 and the conductive layer 32 are provided in the layer 13. The conductive layer 32 includes a region that is embedded in and penetrates the insulating layer 31. The conductive layer 32 is electrically connected to the transistor 103. Furthermore, surfaces of the insulating layer 31 and the conductive layer 32 are planarized to be level with each other.

Here, the conductive layer 32 and the conductive layer 34 preferably have the same metal element as a main component. The surfaces of the insulating layer 31 and the insulating layer 33 are preferably formed of the same components.

For the conductive layers 32 and 34, Cu, Al, Sn, Zn, W, Ag, Pt, or Au can be used, for example. Preferably, Cu, Al, W, or Au is used for easy bonding. An insulating film in which silicon oxide, silicon oxynitride, silicon nitride oxide, silicon nitride, titanium nitride, or the like is stacked on the surface can be used as the insulating films 31 and 33.

That is, the same metal element described above is preferably used for a combination of the conductive layer 32 and the conductive layer 34. Furthermore, the same insulating material described above is preferably used for each of the insulating layer 31 and the insulating layer 33. With this structure, bonding where the boundary between the layer 12 and the layer 13 is a bonding position can be performed.

With the bonding, the electrical connection between the conductive layer 32 and the conductive layer 34 can be obtained. Moreover, the connection between the insulating layer 31 and conductive layer 33 with mechanical strength can be obtained.

For bonding the metal layers to each other, a surface activated bonding method in which an oxide film, a layer adsorbing impurities, and the like on the surface are removed by sputtering treatment or the like and the cleaned and activated surfaces are brought into contact to be bonded to each other can be used. Alternatively, a diffusion bonding method in which the surfaces are bonded to each other by using temperature and pressure together or the like can be used. Both methods cause bonding at an atomic level, and therefore not only electrically but also mechanically excellent bonding can be achieved.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are brought into contact to be bonded to each other temporarily, and then dehydrated by heat treatment to perform final bonding. The hydrophilic bonding method also causes bonding at an atomic level, and therefore mechanically excellent bonding can be achieved.

When the layer 12 and the layer 13 are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above method may be used.

Examples of a package and a camera module in which an image sensor chip is placed will be described below. For the image sensor chip, the structure of the above imaging device can be used.

Figure 14A:
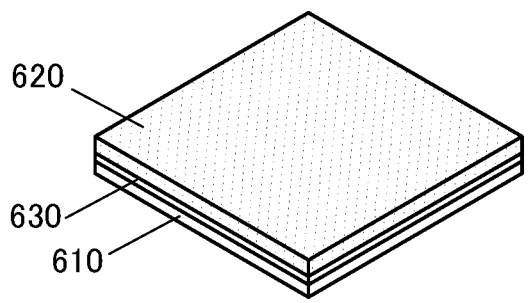
FIG. 14A to FIG. 14F are perspective views illustrating a package and a camera module including an imaging device.

FIG. 14A is an external perspective view of the top surface side of a package in which an image sensor chip is placed. The package includes a package substrate 610 to which an image sensor chip 650 is fixed, a cover glass 620, an adhesive 630 for bonding them, and the like.

Figure 14B:
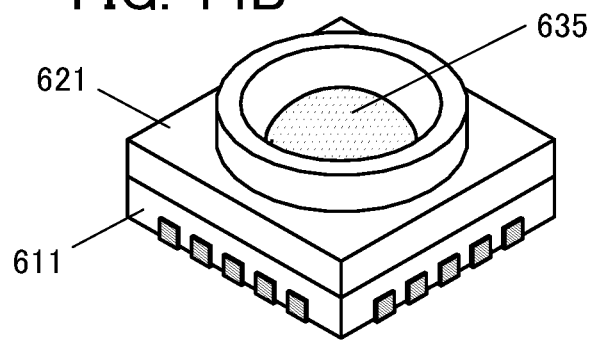
Figure 14C:
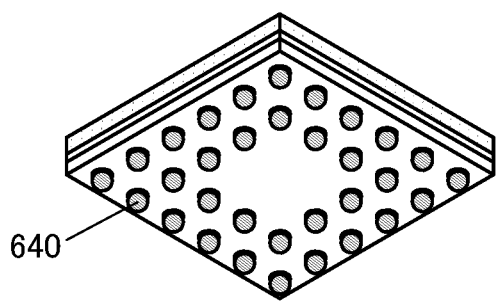

FIG. 14C is an external perspective view of the bottom surface side of the package. A BGA (Ball Grid Array) in which solder balls are used as bumps 640 is included on the bottom surface of the package. Note that, without being limited to the BGA, an LGA (Land Grid Array), a PGA (Pin Grid Array), or the like may be included.

Figure 14D:
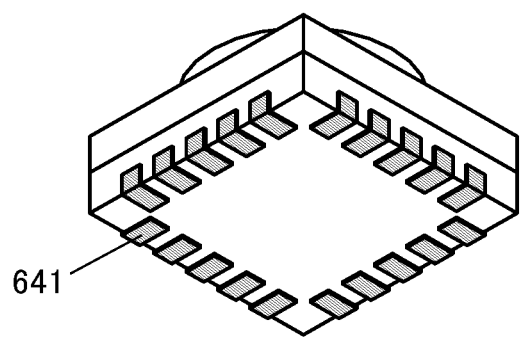
Figure 14E:
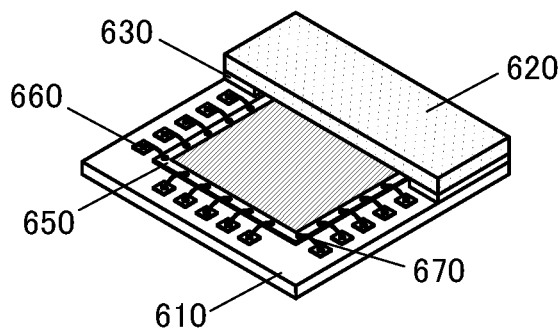

FIG. 14E is a perspective view of the package, in which parts of the cover glass 620 and the adhesive 630 are not illustrated. Electrode pads 660 are formed over the package substrate 610, and the electrode pads 660 and the bumps 640 are electrically connected to each other via through-holes. The electrode pads 660 are electrically connected to the image sensor chip 650 through wires 670.

FIG. 14B is an external perspective view of the top surface side of a camera module in which an image sensor chip is placed in a package with a built-in lens. The camera module includes a package substrate 611 to which an image sensor chip 651 is fixed, a lens cover 621, a lens 635, and the like. Furthermore, an IC chip 690 having a function of a driver circuit, a signal conversion circuit, or the like of an imaging device is provided between the package substrate 611 and the image sensor chip 651; thus, the structure as an SiP (System in Package) is formed.

FIG. 14D is an external perspective view of the bottom surface side of the camera module. A QFN (Quad Flat No-lead package) structure in which lands 641 for mounting are provided on the bottom surface and side surfaces of the package substrate 611 is employed. Note that this structure is an example, and a QFP (Quad Flat Package) or the above-mentioned BGA may also be provided.

Figure 14F:
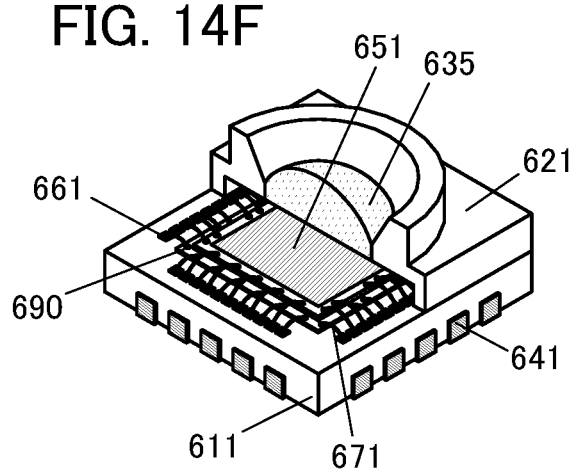

FIG. 14F is a perspective view of the module, in which parts of the lens cover 621 and the lens 635 are not illustrated. The lands 641 are electrically connected to electrode pads 661, and the electrode pads 661 are electrically connected to the image sensor chip 651 or the IC chip 690 through wires 671.

The image sensor chip placed in a package having the above form can be easily mounted on a printed substrate or the like, and the image sensor chip can be incorporated into a variety of semiconductor devices and electronic devices.

This embodiment can be implemented in combination with any of the structures described in the other embodiments and the like, as appropriate.

Embodiment 3

In this embodiment, a structure of a memory device 3300 that can be used for the imaging device of one embodiment of the present invention will be described.

Memory Device

Figure 9:
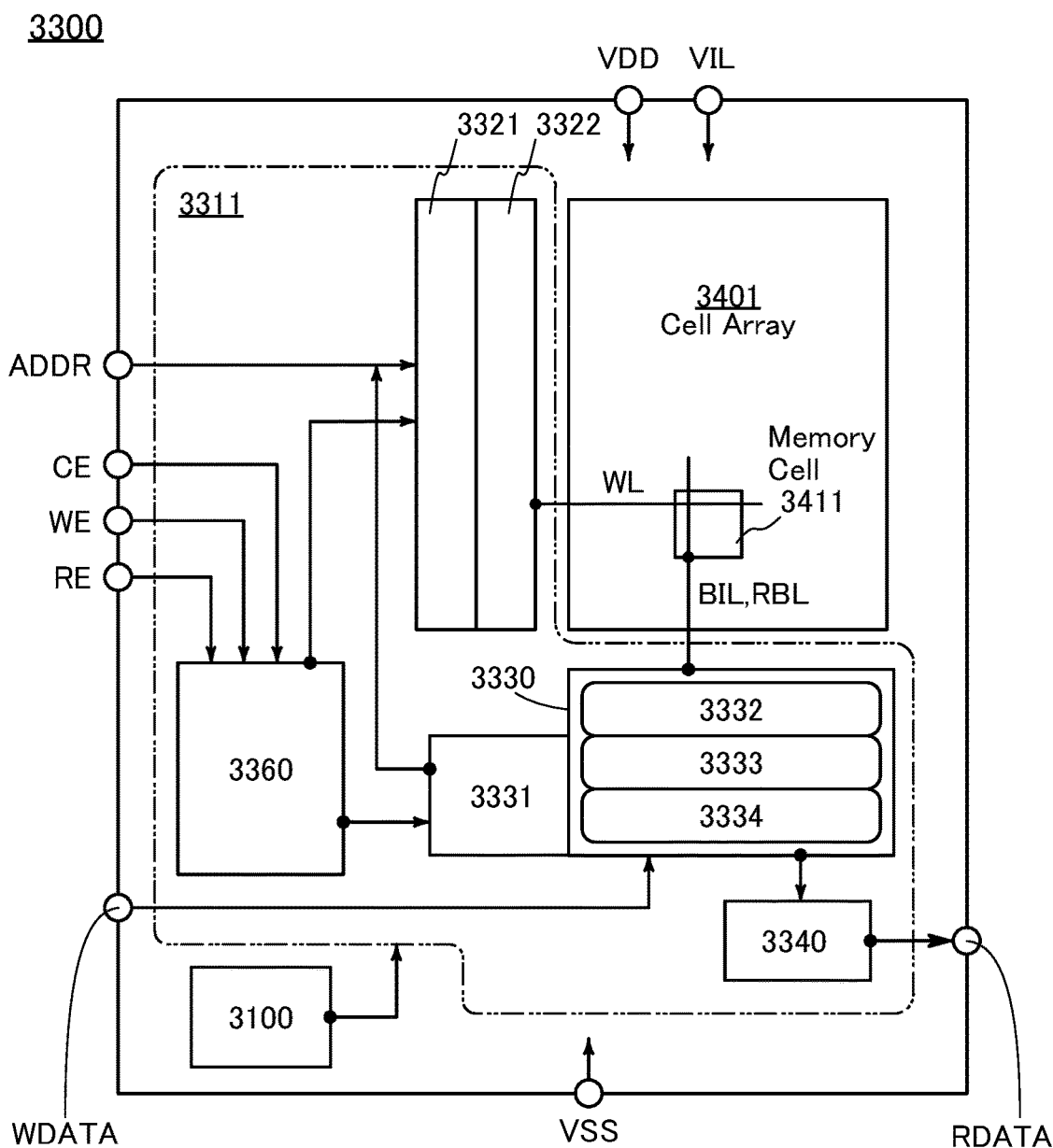
FIG. 9 is a diagram illustrating a structure example of a memory device.

FIG. 9 is a block diagram illustrating a structure example of a memory device. The memory device 3300 includes a peripheral circuit 3311, a cell array 3401, and a semiconductor device 3100. Note that the memory device 3300 corresponds to the circuit 58 described in Embodiment 1.

As power supply voltages, a low power supply voltage (VSS), a high power supply voltage (VDD) for the peripheral circuit 3311, and a high power supply voltage (VIL) for the cell array 3401 are supplied to the memory device 3300 from the outside.

Control signals (CE, WE, RE), an address signal ADDR, and a data signal WDATA are input to the memory device 3300 from the outside. The address signal ADDR is input to a row decoder 3321 and a column decoder 3331, and the data signal WDATA is input to an input/output circuit 3334.

Structure Example of Peripheral Circuit 33111

The peripheral circuit 3311 includes the row decoder 3321, a word line driver circuit 3322, the column decoder 3331, a bit line driver circuit 3330, an output circuit 3340, and a control logic circuit 3360.

The word line driver circuit 3322 has a function of supplying a potential to a wiring WL. The bit line driver circuit 3330 includes a precharge circuit 3332, an amplifier circuit 3333, and the input/output circuit 3334. The precharge circuit 3332 has a function of precharging a wiring SL (not illustrated), a wiring BIL, a wiring RBL, and the like. The amplifier circuit 3333 has a function of amplifying a data signal read from the wiring BIL or the wiring RBL. Note that the wiring WL, the wiring SL, the wiring BIL, and the wiring RBL are wirings connected to a memory cell 3411 included in the cell array 3401 and will be described later in detail. The amplified data signal is output to the outside of the memory device 3300 as a digital data signal RDATA through the output circuit 3340.

The control logic circuit 3360 processes the signals (CE, WE, RE) input from the outside, and generates control signals for the row decoder 3321 and the column decoder 3331. CE is a chip enable signal, WE is a write enable signal, and RE is a read enable signal. Signals processed by the control logic circuit 3360 are not limited thereto, and other control signals are input as necessary.

Note that whether each circuit or each signal described above is provided or not can be appropriately determined as needed.

Structure Example of Cell Array 34011

OS transistors can be used as transistors included in the cell array 3401. Moreover, OS transistors can be used as transistors included in the peripheral circuit 3311. When the cell array 3401 and the peripheral circuit 3311 are formed using OS transistors, the cell array 3401 and the peripheral circuit 3311 can be fabricated in the same manufacturing process, and the manufacturing cost can be kept low.

Figure 10:
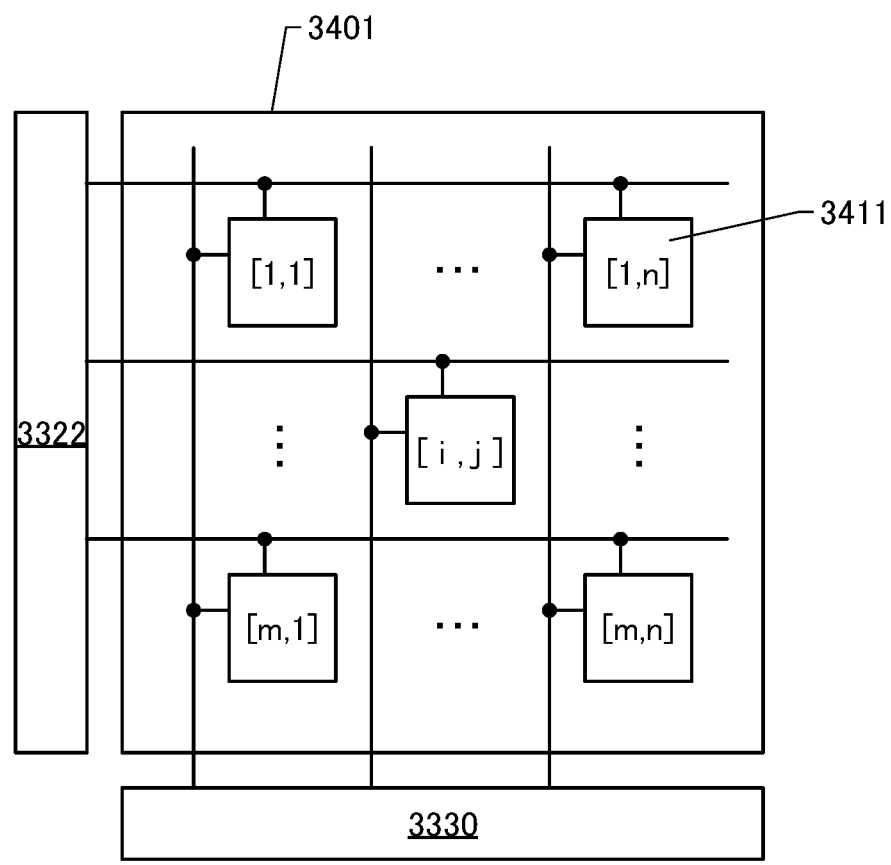
FIG. 10 is a diagram illustrating a structure example of a memory cell array.

FIG. 10 illustrates the details of the cell array 3401. The cell array 3401 includes a total of m×n memory cells 3411 of m cells (m is an integer of 1 or more) in one column and n cells (n is an integer of 1 or more) in one row, and the memory cells 3411 are arranged in a matrix. FIG. 10 also illustrates addresses of the memory cells 3411. For example, [1,1] represents a memory cell 3411 positioned at an address of the first row and the first column, and [i,j] (i is an integer greater than or equal to 1 and less than or equal to m, and j is an integer greater than or equal to 1 and less than or equal to n) represents a memory cell 3411 positioned at an address of the i-th row and the j-th column. The number of wirings connecting the cell array 3401 and the word line driver circuit 3322 is determined by the structure of the memory cell 3411, the number of memory cells 3411 included in one column, or the like. The number of wirings connecting the cell array 3401 and the bit line driver circuit 3330 is determined by the structure of the memory cell 3411, the number of memory cells 3411 included in one row, or the like.

Structure Example of Memory Cell 34111

FIG. 11 illustrates structure examples of a memory cell 3411A to a memory cell 3411D that can be used as the above memory cell 3411.

DOSRAM

Figure 11A:
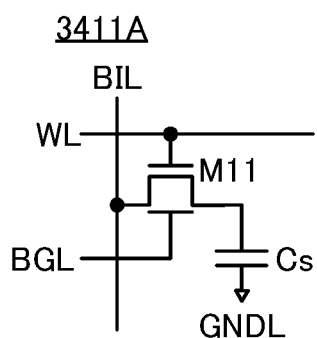
FIG. 11A to FIG. 11D are circuit diagrams illustrating structure examples of memory cells.

FIG. 11A illustrates a circuit structure example of the memory cell 3411A of DRAM type. In this specification and the like, a DRAM using an OS transistor is referred to as a DOSRAM (Dynamic Oxide Semiconductor Random Access Memory). The memory cell 3411A includes a transistor M11 and a capacitor Cs.

A first terminal of the transistor M11 is connected to a first terminal of the capacitor Cs, a second terminal of the transistor M11 is connected to the wiring BIL, a gate of the transistor M11 is connected to the wiring WL, and a back gate of the transistor M11 is connected to a wiring BGL. A second terminal of the capacitor Cs is connected to a wiring GNDL. The wiring GNDL is a wiring that supplies a low-level potential (sometimes referred to as a reference potential).

The wiring BIL functions as a bit line, and the wiring WL functions as a word line. The wiring BGL functions as a wiring for applying a potential to the back gate of the transistor M11. The wiring BGL is electrically connected to an output terminal OUT of the semiconductor device 3100. By applying a given potential to the wiring BGL, the threshold voltage of the transistor M11 can be increased or decreased.

Data writing and reading are performed in such a manner that a high-level potential is applied to the wiring WL to turn on the transistor M11 so that the wiring BIL is electrically connected to the first terminal of the capacitor Cs.

The memory cell included in the memory device 3300 is not limited to the memory cell 3411A, and the circuit structure can be changed.

In the case where the transistor M11 is used in the memory cell, an OS transistor is preferably used as the transistor M11. For a semiconductor layer of the OS transistor, an oxide semiconductor containing one of indium, an element M (the element M is aluminum, gallium, yttrium, or tin), and zinc is preferably used. In particular, an oxide semiconductor formed of indium, gallium, and zinc is preferably used.

The OS transistor using the oxide semiconductor containing indium, gallium, and zinc has a feature of an extremely low off-state current. The use of the OS transistor as the transistor M11 enables the leakage current of the transistor M11 to be extremely low. That is, written data can be retained for a long time by the transistor M11; thus, the frequency of refresh of the memory cell can be reduced. Alternatively, the refresh operation of the memory cell can be omitted. In addition, the extremely low leakage current allows multi-level data or analog data to be retained in the memory cell 3411A, the memory cell 3411B, the memory cell 3411C, and the memory cell D.

A DOSRAM can be formed by using the OS transistor as the transistor M11.

NOSRAM

Figure 11B:
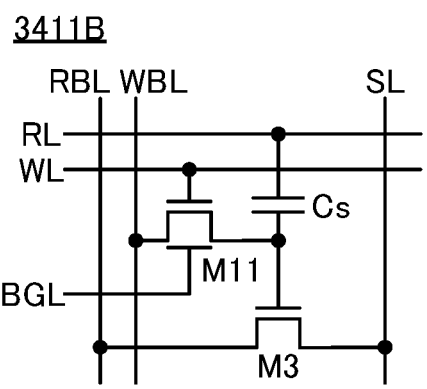

FIG. 11B illustrates a circuit structure example of the memory cell 3411B that is of a gain cell including two transistors and one capacitor (also referred to as "2Tr1C-type"). The memory cell 3411B includes the transistor M11, a transistor M3, and the capacitor Cs.

The first terminal of the transistor M11 is connected to the first terminal of the capacitor Cs, the second terminal of the transistor M11 is connected to a wiring WBL, the gate of the transistor M11 is connected to the wiring WL, and the back gate of the transistor M11 is connected to the wiring BGL. The second terminal of the capacitor Cs is connected to a wiring RL. A first terminal of the transistor M3 is connected to the wiring RBL, a second terminal of the transistor M3 is connected to the wiring SL, and a gate of the transistor M3 is connected to the first terminal of the capacitor Cs.

The wiring WBL functions as a write bit line, the wiring RBL functions as a read bit line, and the wiring WL functions as a word line. The wiring RL functions as a wiring for applying a predetermined potential to the second terminal of the capacitor Cs. The reference potential is preferably applied to the wiring RL at the time of data writing and during data retention.

The wiring BGL functions as a wiring for applying a potential to the back gate of the transistor M11. The wiring BGL is electrically connected to the output terminal OUT of the semiconductor device 3100. By applying a given potential to the wiring BGL, the threshold voltage of the transistor M11 can be increased or decreased.

Data writing is performed in such a manner that a high-level potential is applied to the wiring WL to turn on the transistor M11 so that the wiring WBL is electrically connected to the first terminal of the capacitor Cs. Specifically, when the transistor M11 is in an on state, a potential corresponding to information to be stored is applied to the wiring WBL, whereby the potential is written to the first terminal of the capacitor Cs and the gate of the transistor M3. After that, a low-level potential is applied to the wiring WL to turn off the transistor M11, whereby the potential of the first terminal of the capacitor Cs and the potential of the gate of the transistor M3 are retained.

Data reading is performed by applying a predetermined potential to the wiring RL and the wiring SL. A current flowing between a source and a drain of the transistor M3 and the potential of the first terminal of the transistor M3 are determined by the potential of the gate of the transistor M3 and the potential of the second terminal of the transistor M3; thus, by reading out the potential of the wiring RBL connected to the first terminal of the transistor M3, the potential retained at the first terminal of the capacitor Cs (or the gate of the transistor M3) can be read. In other words, information written to this memory cell can be read from the potential retained at the first terminal of the capacitor Cs (or the gate of the transistor M3). Alternatively, existence or absence of information written to this memory cell can be found.

The memory cell included in the memory device 3300 is not limited to the memory cell 3411B, and the circuit structure can be changed as appropriate.

Figure 11C:
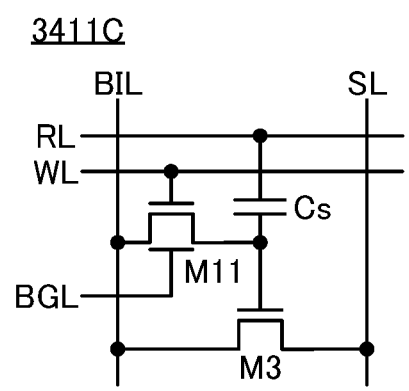

For example, the wiring WBL and the wiring RBL may be combined into one wiring BIL. FIG. 11C illustrates a circuit structure example of the memory cell. In the memory cell 3411C, one wiring BIL corresponds to the wiring WBL and the wiring RBL in the memory cell 3411B, and the second terminal of the transistor M11 and the first terminal of the transistor M3 are connected to the wiring BIL. In other words, in the memory cell 3411C, a write bit line and a read bit line are operated as one wiring BIL.

Note that also in the memory cell 3411B and the memory cell 3411C, an OS transistor is preferably used as the transistor M11. A memory device using a 2Tr1C-type memory cell using an OS transistor as the transistor M11, such as the memory cell 3411B and the memory cell 3411C, is referred to as a NOSRAM (Non-volatile Oxide Semiconductor Random Access Memory).

Note that a channel formation region of the transistor M3 preferably contains silicon. In particular, the silicon can be amorphous silicon, polycrystalline silicon, or low temperature poly-silicon (LTPS). Since a Si transistor has higher field-effect mobility than that of an OS transistor in some cases, the use of the Si transistor as a read transistor is suitable.

In the case where an OS transistor is used as the transistor M3, the memory cell can be composed of a single-polarity circuit.

Figure 11D:
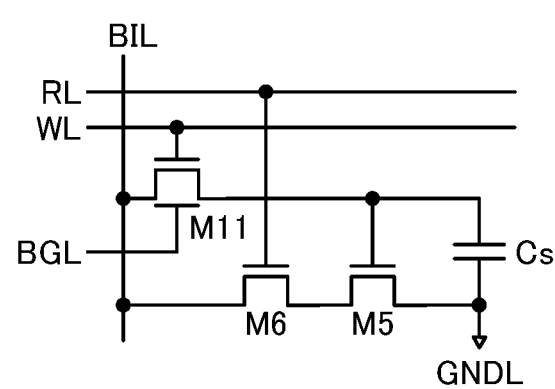

FIG. 11D illustrates a circuit structure example of the memory cell 3411D that is of a gain cell including three transistors and one capacitor (also referred to as "3Tr1C-type"). The memory cell 3411D includes the transistor M11, a transistor M5, a transistor M6, and the capacitor Cs.

The first terminal of the transistor M11 is connected to the first terminal of the capacitor Cs, the second terminal of the transistor M11 is connected to the wiring BIL, the gate of the transistor M11 is connected to the wiring WL, and the back gate of the transistor M11 is electrically connected to the wiring BGL. The second terminal of the capacitor Cs is electrically connected to a first terminal of the transistor M5 and the wiring GNDL. A second terminal of the transistor M5 is connected to a first terminal of the transistor M6, and a gate of the transistor M5 is connected to the first terminal of the capacitor Cs. A second terminal of the transistor M6 is connected to the wiring BIL, and a gate of the transistor M6 is connected to the wiring RL.

The wiring BIL functions as a bit line, the wiring WL functions as a write word line, and the wiring RL functions as a read word line.

The wiring BGL functions as a wiring for applying a potential to the back gate of the transistor M11. The wiring BGL is electrically connected to the output terminal OUT of the semiconductor device 3100. By applying a given potential to the wiring BGL, the threshold voltage of the transistor M11 can be increased or decreased.

Data writing is performed in such a manner that a high-level potential is applied to the wiring WL to turn on the transistor M11 so that the wiring BIL is connected to the first terminal of the capacitor Cs. Specifically, when the transistor M11 is in an on state, a potential corresponding to information to be stored is applied to the wiring BIL, whereby the potential is written to the first terminal of the capacitor Cs and the gate of the transistor M5. After that, a low-level potential is applied to the wiring WL to turn off the transistor M11, whereby the potential of the first terminal of the capacitor Cs and the potential of the gate of the transistor M5 are retained.

Data reading is performed in such a manner that after a predetermined potential is precharged to the wiring BIL, the wiring BIL is made in an electrically floating state, and a high-level potential is applied to the wiring RL. Since the wiring RL has the high-level potential, the transistor M6 is turned on, which electrically connects the wiring BIL and the second terminal of the transistor M5. At this time, the potential of the wiring BIL is applied to the second terminal of the transistor M5; the potential of the second terminal of the transistor M5 and the potential of the wiring BIL are changed in accordance with the potential retained at the first terminal of the capacitor Cs (or the gate of the transistor M5). Here, by reading out the potential of the wiring BIL, the potential retained at the first terminal of the capacitor Cs (or the gate of the transistor M5) can be read. In other words, information written to this memory cell can be read from the potential retained at the first terminal of the capacitor Cs (or the gate of the transistor M5). Alternatively, existence or absence of information written to this memory cell can be found.

The circuit structure of the memory cell included in the memory device 3300 can be changed as appropriate.

Note that also in the memory cell 3411D, an OS transistor is preferably used as the transistor M11. The 3Tr1C-type memory cell 3411D using an OS transistor as the transistor M11 is one embodiment of the NOSRAM.

Note that channel formation regions of the transistors M5 and M6 described in this embodiment preferably contain silicon. In particular, the silicon can be amorphous silicon, polycrystalline silicon, or low-temperature polysilicon. Since a Si transistor has higher field-effect mobility than that of an OS transistor in some cases, the use of the Si transistor as a read transistor is suitable.

In the case where OS transistors are used as the transistors M5 and M6, the memory cell can be composed of a single-polarity circuit.

This embodiment can be implemented in combination with any of the structures described in the other embodiments and the like, as appropriate.

Embodiment 4

In this embodiment, a structure of a memory device that can be used for the imaging device of one embodiment of the present invention will be described with reference to FIG. 12 and FIG. 13.

Memory device 11

Figure 12:
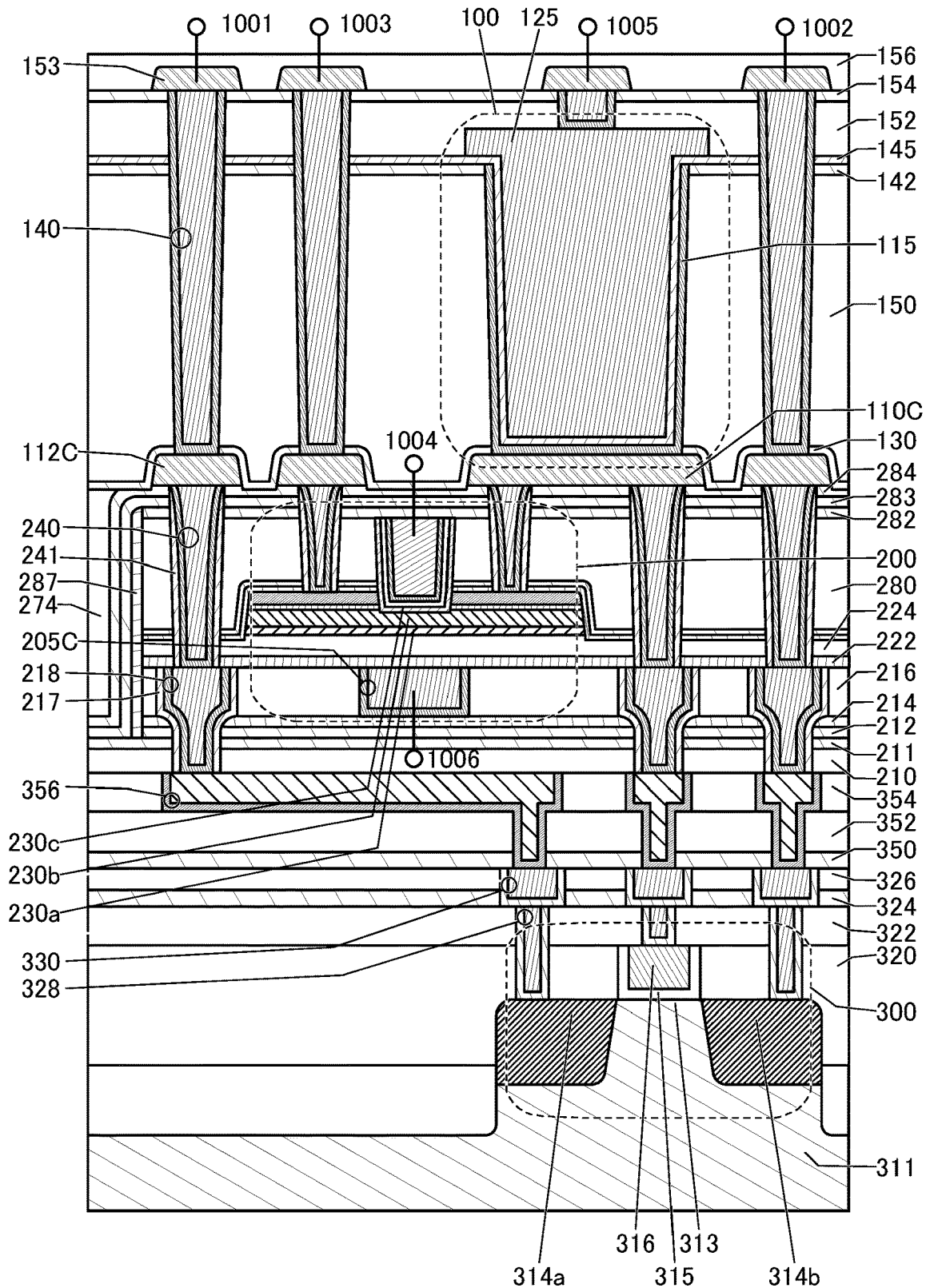
FIG. 12 is a cross-sectional view illustrating a structure of a semiconductor device.

The memory device that can be used for the imaging device of one embodiment of the present invention includes a transistor 200, a transistor 300, and a capacitor 100 (see FIG. 12). The transistor 200 is provided above the transistor 300, and the capacitor 100 is provided above the transistor 300 and the transistor 200.

The transistor 200 is a transistor whose channel is formed in a semiconductor layer including an oxide semiconductor. Since the transistor 200 has a low off-state current, a memory device using the transistor 200 can retain stored data for a long time. In other words, such a memory device does not require refresh operation or has an extremely low frequency of the refresh operation, which leads to a sufficient reduction in power consumption of the memory device. Furthermore, an oxide 230a, an oxide 230b, and an oxide 230c can be used as the oxide semiconductor included in the semiconductor layer. Specifically, as the oxide 230a, a metal oxide having In:Ga:Zn=1:3:4 [atomic ratio] or a composition in the vicinity thereof, or 1:1:0.5 [atomic ratio] or a composition in the vicinity thereof is used.

As the oxide 230b, a metal oxide having In:Ga:Zn=4:2:3 [atomic ratio] or a composition in the vicinity thereof, or 1:1:1 [atomic ratio] or a composition in the vicinity thereof is used. As the oxide 230b, a metal oxide having In:Ga:Zn=5:1:3 [atomic ratio] or a composition in the vicinity thereof, or In:Ga:Zn=10:1:3 [atomic ratio] or a composition in the vicinity thereof may be used. In addition, as the oxide 230b, an In—Zn oxide (for example, having In:Zn=2:1 [atomic ratio] or a composition in the vicinity thereof, In:Zn=5:1 [atomic ratio] or a composition in the vicinity thereof, or In:Zn=10:1 [atomic ratio] or a composition in the vicinity thereof) may be used. An In oxide may be used as the oxide 230b.

As the oxide 230c, a metal oxide having In:Ga:Zn=1:3:4 [atomic ratio or a composition in the vicinity thereof], Ga:Zn=2:1 [atomic ratio] or a composition in the vicinity thereof, or Ga:Zn=2:5 [atomic ratio] or a composition in the vicinity thereof is used. The material that can be used for the oxide 230b may be used for the oxide 230c as a single layer or stacked layers. Specific examples of the oxide 230c having a stacked-layer structure include a stacked-layer structure of In:Ga:Zn=4:2:3 [atomic ratio] or a composition in the vicinity thereof and In:Ga:Zn=1:3:4 [atomic ratio] or a composition in the vicinity thereof, a stacked-layer structure of Ga:Zn=2:1 [atomic ratio] or a composition in the vicinity thereof and In:Ga:Zn=4:2:3 [atomic ratio] or a composition in the vicinity thereof, a stacked-layer structure of Ga:Zn=2:5 [atomic ratio] or a composition in the vicinity thereof and In:Ga:Zn=4:2:3 [atomic ratio] or a composition in the vicinity thereof, and a stacked-layer structure of gallium oxide and In:Ga:Zn=4:2:3 [atomic ratio] or a composition in the vicinity thereof.

When the proportion of indium in a film is increased for the oxides 230b and 230c, the on-state current, field-effect mobility, and the like of the transistors can be increased, which is suitable. Note that in the above compositions in the vicinity means an atomic ratio within ±30% of an intended atomic ratio.

In the memory device illustrated in FIG. 12, a wiring 1001 is electrically connected to a source of the transistor 300, and a wiring 1002 is electrically connected to a drain of the transistor 300. A wiring 1003 is electrically connected to one of a source and a drain of the transistor 200, a wiring 1004 is electrically connected to a first gate of the transistor 200, and a wiring 1006 is electrically connected to a second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

Furthermore, by arranging the memory devices illustrated in FIG. 12 in a matrix, a memory cell array can be formed.

Transistor 300

The transistor 300 is provided over a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as the source region and the drain region. The transistor 300 may be a p-channel transistor or an n-channel transistor.

Here, in the transistor 300 illustrated in FIG. 12, the semiconductor region 313 (part of the substrate 311) in which a channel is formed has a convex shape. Furthermore, the conductor 316 is provided so as to cover a side surface and top surface of the semiconductor region 313 with the insulator 315 therebetween. Note that a material adjusting the work function may be used for the conductor 316. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 12 is an example and the structure is not limited thereto; an appropriate transistor may be used in accordance with a circuit structure or a driving method.

Capacitor 100

The capacitor 100 is provided above the transistor 200. The capacitor 100 includes a conductor 110C functioning as a first electrode, a conductor functioning as a second electrode, and an insulator functioning as a dielectric. In addition, a conductor 115, a conductor 125, a conductor 140, an insulator 142, an insulator 145, an insulator 152, a conductor 153, an insulator 154, and an insulator 156 are included.

For example, a conductor 112C and the conductor 110C can be formed at the same time. Note that the conductor 112C has a function of a plug or a wiring that is electrically connected to the capacitor 100, the transistor 200, or the transistor 300.

Although the conductor 112C and the conductor 110C having a single-layer structure are illustrated in FIG. 12, the structure is not limited thereto; a stacked-layer structure of two or more layers may be employed. For example, between a conductor having a bather property and a conductor having high conductivity, a conductor that is highly adhesive to the conductor having a bather property and the conductor having high conductivity may be formed.

The insulator of the capacitor (that serves as a dielectric) can be formed as stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, for the insulator of the capacitor (that serves as a dielectric), a stacked-layer structure of a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

As the insulator of a high permittivity (high-k) material (a material having a high dielectric constant), gallium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator of the capacitor (that serves as a dielectric). In the case where the insulator has a stacked-layer structure, a three-layer stack with zirconium oxide, aluminum oxide, and zirconium oxide in this order, or a four-layer stack with zirconium oxide, aluminum oxide, zirconium oxide, and aluminum oxide in this order can be employed, for example. For the insulator, a compound containing hafnium and zirconium, or the like may be used. With miniaturization and high integration of transistors, a problem such as leakage current may arise because of a thinner gate insulator. When a high-k material is used as an insulator functioning as the gate insulator, a gate potential during operation of the transistor can be lowered while the physical thickness of the gate insulator is maintained.

As the material having a high dielectric strength (a material having a low dielectric constant), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

Wiring Layer

Wiring layers provided with an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component.

That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 12, an insulator 350, an insulator 352, and an insulator 354 are stacked in this order. Furthermore, a conductor 356 is formed in the insulator 350, the insulator 352, and the insulator 354. The conductor 356 functions as a plug or a wiring.

Similarly, a conductor 218, a conductor (a conductor 205C) included in the transistor 200, and the like are embedded in an insulator 210, an insulator 211, an insulator 212, an insulator 214, and an insulator 216. Note that the conductor 218 has a function of a plug or a wiring that is electrically connected to the capacitor 100 or the transistor 300. In addition, an insulator 150 is provided over a conductor 120 and an insulator 130.

Here, like an insulator 241 described in the above embodiment, an insulator 217 is provided in contact with a side surface of the conductor 218 functioning as a plug. The insulator 217 is provided in contact with an inner wall of an opening formed in the insulator 210, the insulator 211, the insulator 212, the insulator 214, and the insulator 216. That is, the insulator 217 is provided between the conductor 218 and the insulator 210, the insulator 211, the insulator 212, the insulator 214, and the insulator 216. Note that the conductor 205C and the conductor 218 can be formed in parallel; thus, the insulator 217 is sometimes formed in contact with a side surface of the conductor 205C.

As the insulator 217, for example, an insulator such as silicon nitride, aluminum oxide, or silicon nitride oxide is used. The insulator 217 is provided in contact with the insulator 211, the insulator 212, the insulator 214, and the insulator 222; thus, impurities such as water and hydrogen can be inhibited from entering the oxide 230 from the insulator 210, the insulator 216, or the like through the conductor 218. Silicon nitride is particularly preferable because of its high hydrogen blocking property. Furthermore, oxygen contained in the insulator 210 or the insulator 216 can be prevented from being absorbed by the conductor 218.

The insulator 217 can be formed in a manner similar to that of the insulator 241. For example, silicon nitride is deposited by a PEALD method and an opening reaching the conductor 356 is formed by anisotropic etching.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, the parasitic capacitance generated between wirings can be reduced. Accordingly, a material is preferably selected in accordance with the function of an insulator.

For example, the insulator 150, the insulator 210, the insulator 352, the insulator 354, and the like preferably include an insulator having a low dielectric constant. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon or aramid), polyimide, polycarbonate, and acrylic resin.

When a transistor using an oxide semiconductor is surrounded by insulators having a function of inhibiting passage of oxygen and impurities such as hydrogen, the electrical characteristics of the transistor can be stable. Thus, an insulator having a function of inhibiting passage of oxygen and impurities such as hydrogen is used as the insulator 214, the insulator 211, the insulator 212, the insulator 350, and the like.

For the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112C, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

Wiring or Plug in Layer Provided with Oxide Semiconductor

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and a conductor provided in the insulator including the excess oxygen region.

For example, in FIG. 12, the insulator 241 is preferably provided between a conductor 240 and an insulator 224 and an insulator 280 that contain excess oxygen. Since the insulator 241 is provided in contact with the insulator 222, an insulator 272, an insulator 273, an insulator 282, an insulator 283, and an insulator 284, the insulator 224 and the transistor 200 can be sealed by the insulators having a barrier property.

That is, the insulator 241 can inhibit excess oxygen contained in the insulator 224 and the insulator 280 from being absorbed by the conductor 240. In addition, the insulator 241 can inhibit diffusion of hydrogen, which is an impurity, into the transistor 200 through the conductor 240.

Note that an insulating material having a function of inhibiting diffusion of oxygen and impurities such as water and hydrogen is preferably used for the insulator 241. For example, silicon nitride, silicon nitride oxide, aluminum oxide, hafnium oxide, or the like is preferably used. Silicon nitride is particularly preferable because of its high hydrogen blocking property. Alternatively, for example, a metal oxide such as magnesium oxide, gallium oxide, germanium oxide, yttrium oxide, zirconium oxide, lanthanum oxide, neodymium oxide, or tantalum oxide can be used.

As in the above embodiment, the transistor 200 is preferably sealed with the insulator 211, the insulator 212, the insulator 214, an insulator 287, the insulator 282, the insulator 283, and the insulator 284. With such a structure, entry of hydrogen contained in an insulator 274, the insulator 150, or the like into the insulator 280 or the like can be reduced.

Here, the conductor 240 penetrates the insulator 284, the insulator 283, and the insulator 282, and the conductor 218 penetrates the insulator 214, the insulator 212, and the insulator 211; however, as described above, the insulator 241 is provided in contact with the conductor 240, and the insulator 217 is provided in contact with the conductor 218. This can reduce hydrogen entering the inside of the insulator 211, the insulator 212, the insulator 214, the insulator 287, the insulator 282, the insulator 283, and the insulator 284 through the conductor 240 and the conductor 218. In this manner, the transistor 200 is sealed more surely with the insulator 211, the insulator 212, the insulator 214, the insulator 287, the insulator 282, the insulator 283, the insulator 284, the insulator 241, and the insulator 217, so that impurities such as hydrogen contained in the insulator 274 or the like can be inhibited from entering from the outside.

As described in the above embodiment, the insulator 216, the insulator 224, the insulator 280, an insulator 250, and the insulator 274 are preferably formed by a deposition method using a gas in which hydrogen atoms are reduced or removed. This can reduce the hydrogen concentration of the insulator 216, the insulator 224, the insulator 280, the insulator 250, and the insulator 274.

In this manner, the hydrogen concentration of silicon-based insulating films in the vicinity of the transistor 200 can be reduced; thus, the hydrogen concentration of the oxide 230 can be reduced.

Dicing Line

A dicing line (referred to as a scribe line, a dividing line, or a cutting line in some cases) that is provided when a large-sized substrate is divided into semiconductor elements so that a plurality of memory devices are obtained in a chip form will be described below. Examples of a dividing method include the case where a groove (a dicing line) for dividing the semiconductor elements is formed on the substrate, and then the substrate is cut along the dicing line to divide (split) it into a plurality of memory devices.

Here, for example, as illustrated in FIG. 12, a region where the insulator 283 is in contact with the insulator 211 preferably overlaps with the dicing line. That is, an opening is provided in the insulator 282, the insulator 280, the insulator 273, the insulator 272, the insulator 224, the insulator 222, the insulator 216, the insulator 214, and the insulator 212 in the vicinity of a region to be the dicing line that is provided on the outer edge of a memory cell including a plurality of transistors 200.

That is, in the opening provided in the insulator 282, the insulator 280, the insulator 273, the insulator 272, the insulator 224, the insulator 222, the insulator 216, the insulator 214, and the insulator 212, the insulator 211 is in contact with the insulator 283. Alternatively, an opening may be provided in the insulator 282, the insulator 280, the insulator 273, the insulator 272, the insulator 224, the insulator 222, the insulator 216, and the insulator 214, and the insulator 212 and the insulator 283 may be in contact with each other in the opening. For example, the insulator 212 and the insulator 283 may be formed using the same material and the same method. When the insulator 212 and the insulator 283 are formed using the same material and the same method, the adhesion therebetween can be increased. For example, silicon nitride is preferably used.

With such a structure, the transistor 200 can be surrounded with the insulator 211, the insulator 212, the insulator 214, the insulator 287, the insulator 282, the insulator 283, and the insulator 284. At least one of the insulator 211, the insulator 212, the insulator 214, the insulator 287, the insulator 282, the insulator 283, and the insulator 284 has a function of inhibiting diffusion of oxygen, hydrogen, and water; thus, even when the substrate is divided into circuit regions each of which is provided with the semiconductor elements in this embodiment to form a plurality of chips, entry and diffusion of impurities such as hydrogen or water from the direction of a side surface of the divided substrate to the transistor 200 can be inhibited.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, in the transistor 200, a change in the electrical characteristics can be inhibited and reliability can be improved.

The above is the description of the structure example. With the use of the structure, a change in electrical characteristics can be inhibited and reliability can be improved in a memory device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a memory device with low power consumption can be provided.

Memory Device 21

Figure 13:
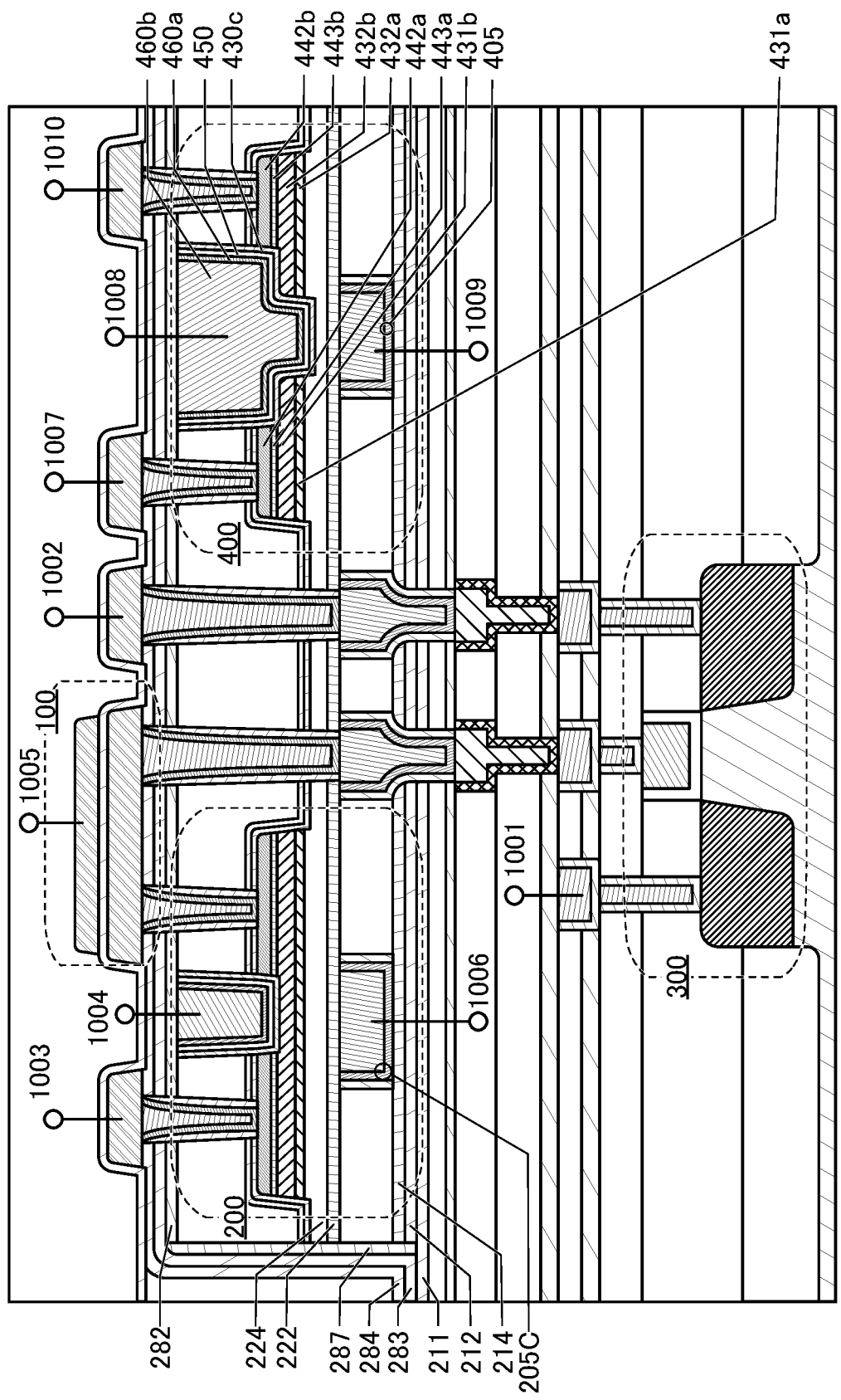
FIG. 13 is a cross-sectional view illustrating a structure of a semiconductor device.

A structure of the memory device of one embodiment of the present invention is illustrated in FIG. 13. The memory device of one embodiment of the present invention includes the transistor 200, the transistor 300, a transistor 400, and the capacitor 100.

The transistor 400 can control a second gate voltage of the transistor 200. For example, a first gate and a second gate of the transistor 400 are diode-connected to a source of the transistor 400, and the source of the transistor 400 is connected to the second gate of the transistor 200. When a negative potential of the second gate of the transistor 200 is retained in this structure, a first gate-source voltage and a second gate-source voltage of the transistor 400 become 0 V. In the transistor 400, a drain current at the time when a second gate voltage and a first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored data for a long time.

In FIG. 13, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to a gate of the transistor 200, and the wiring 1006 is electrically connected to a back gate of the transistor 200. The gate of the transistor 300 and the other of the source and the drain of the transistor 200 are electrically connected to one electrode of the capacitor 100, and the wiring 1005 is electrically connected to the other electrode of the capacitor 100. A wiring 1007 is electrically connected to the source of the transistor 400, a wiring 1008 is electrically connected to a gate of the transistor 400, a wiring 1009 is electrically connected to a back gate of the transistor 400, a wiring 1010 is electrically connected to the drain of the transistor 400. Here, the wiring 1006, the wiring 1007, the wiring 1008, and the wiring 1009 are electrically connected to each other.

Furthermore, by arranging the memory devices illustrated in FIG. 13 in a matrix like the memory devices illustrated in FIG. 12, a memory cell array can be formed. Note that one transistor 400 can control second gate voltages of the plurality of transistors 200. For this reason, the number of the transistors 400 is preferably smaller than that of the transistors 200. As in the memory device illustrated in FIG. 12, the transistor 200 and the transistor 400 in the memory device illustrated in FIG. 13 can be sealed with the insulator 211, the insulator 212, the insulator 214, the insulator 287, the insulator 282, the insulator 283, and the insulator 284.

Transistor 400

The transistor 400 and the transistors 200 are formed in the same layer and thus can be fabricated in parallel. The transistor 400 includes a conductor 460 (a conductor 460a and a conductor 460b) functioning as a first gate, a conductor 405 functioning as a second gate, the insulator 222, the insulator 224, and an insulator 450 functioning as gate insulating layers, an oxide 430c including a channel formation region, a conductor 442a, an oxide 443a, an oxide 431a, and an oxide 431b functioning as a source, and a conductor 442b, an oxide 443b, an oxide 432a, and an oxide 432b functioning as a drain. As in the transistor 200, conductors functioning as plugs are provided in contact with the conductor 442a and the conductor 442b.

Note that the structure bodies formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen or water are reduced, as in the oxide 230 or the like. Accordingly, the threshold voltage of the transistor 400 can be higher than 0 V, the off-state current can be reduced, and the drain current at the time when the second gate voltage and the first gate voltage are 0 V can be extremely low.

This embodiment can be implemented in combination with any of the structures described in the other embodiments and the like, as appropriate.

Embodiment 5

Examples of an electronic device that can use the imaging device of one embodiment of the present invention include display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 15A to FIG. 15F illustrate specific examples of such electronic devices.

Figure 15A:
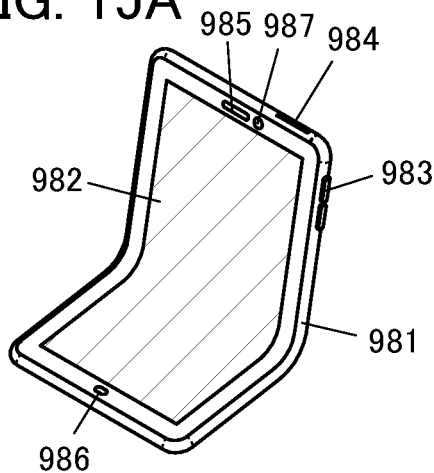
FIG. 15A to FIG. 15F are diagrams illustrating electronic devices.

FIG. 15A is an example of a mobile phone, which includes a housing 981, a display portion 982, an operation button 983, an external connection port 984, a speaker 985, a microphone 986, a camera 987, and the like. The display portion 982 of the mobile phone includes a touch sensor. All operations including making a call and inputting text can be performed by touch on the display portion 982 with a finger, a stylus, or the like. The imaging device of one embodiment of the present invention can be used as a component for image capturing in the mobile phone.

Figure 15B:
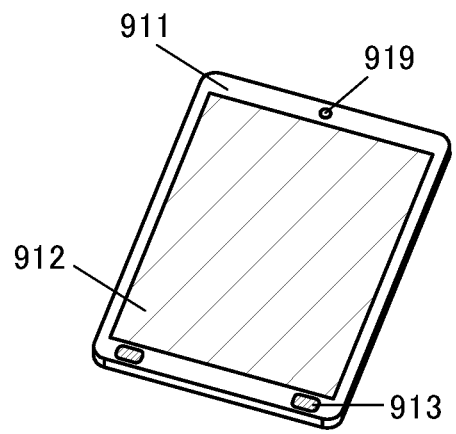

FIG. 15B is a portable data terminal, which includes a housing 911, a display portion 912, speakers 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention can be used as a component for image capturing in the portable data terminal.

Figure 15C:
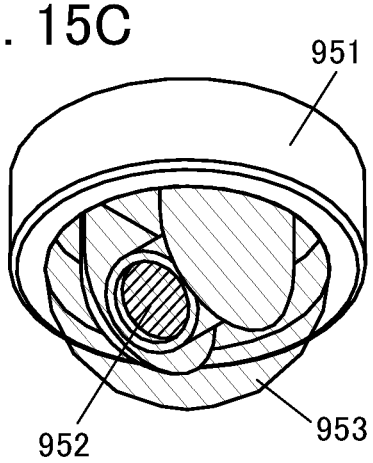

FIG. 15C is a surveillance camera, which includes a support base 951, a camera unit 952, a protection cover 953, and the like. The camera unit 952 is provided with a rotation mechanism and the like and can capture an image of all of the surroundings when provided on a ceiling. The imaging device of one embodiment of the present invention can be used as a component for image capturing in the camera unit. Note that a surveillance camera is a name in common use and does not limit the use thereof. For example, a device that has a function of a surveillance camera can also be called a camera or a video camera.

Figure 15D:
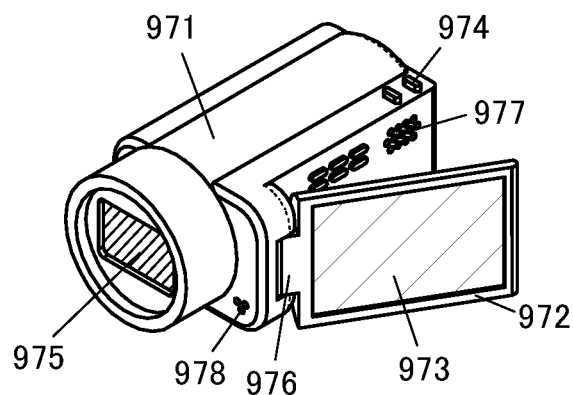

FIG. 15D is a video camera, which includes a first housing 971, a second housing 972, a display portion 973, operation keys 974, a lens 975, a connection portion 976, a speaker 977, a microphone 978, and the like. The operation keys 974 and the lens 975 are provided for the first housing 971, and the display portion 973 is provided for the second housing 972. The imaging device of one embodiment of the present invention can be used as a component for image capturing in the video camera.

Figure 15E:
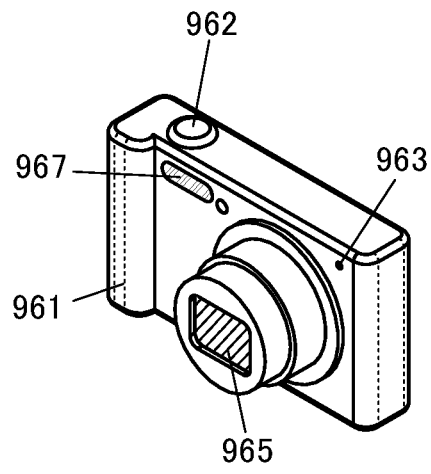

FIG. 15E is a digital camera, which includes a housing 961, a shutter button 962, a microphone 963, a light-emitting portion 967, a lens 965, and the like. The imaging device of one embodiment of the present invention can be used as a component for image capturing in the digital camera.

Figure 15F:
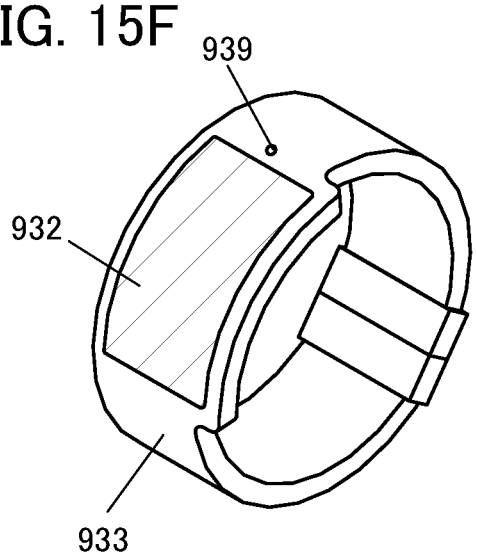

FIG. 15F is a wrist-watch-type information terminal, which includes a display portion 932, a housing 933 also serving as a wristband, a camera 939, and the like. The display portion 932 is provided with a touch panel for operating the information terminal. The display portion 932 and the housing 933 also serving as a wristband have flexibility and fit a body well. The imaging device of one embodiment of the present invention can be used as a component for image capturing in the information terminal.

This embodiment can be implemented in combination with any of the structures described in the other embodiments and the like, as appropriate.

REFERENCE NUMERALS

BGL: wiring, BL: wiring, BIL: wiring, Cs: capacitor, GNDL: wiring, M3: transistor, M5: transistor, M6: transistor, M11: transistor, SL: wiring, T1: period, T2: period, T3: period, T4: period, RBL: wiring, RL: wiring, WBL: wiring, WL: wiring, 12: layer, 13: layer, 14: layer, 21: single crystal silicon substrate, 22: region, 25: silicon substrate, 28: region, 31: insulating layer, 32: conductive layer, 33: insulating layer, 34: conductive layer, 50: pixel circuit, 51: pixel array, 52: circuit, 53: circuit, 54: circuit, 55: circuit, 56: circuit, 57: circuit, 58: circuit, 59: circuit, 63: insulating layer, 64: insulating layer, 65: insulating layer, 66: insulating layer, 100: capacitor, 101: photoelectric conversion device, 102: transistor, 103: transistor, 104: transistor, 105: transistor, 106: transistor, 107: transistor, 108: capacitor, 109: capacitor, 110: circuit, 110C: conductor, 111: cell, 112: transistor, 112C: conductor, 113: transistor, 120: conductor, 121: wiring, 122: wiring, 123: wiring, 126: wiring, 127: wiring, 128: wiring, 129: wiring, 130: insulator, 131: wiring, 132: wiring, 150: insulator, 200: transistor, 201: gate electrode, 202: gate insulating film, 203: source region, 204: drain region, 205: source electrode, 205C: conductor, 206: drain electrode, 207: oxide semiconductor layer, 208: oxide semiconductor layer, 210: insulator, 211: insulator, 212: insulator, 214: insulator, 216: insulator, 217: insulator, 218: conductor, 222: insulator, 224: insulator, 230: oxide, 230a: oxide, 230b: oxide, 230c: oxide, 240: conductor, 241: insulator, 250: insulator, 272: insulator, 273: insulator, 274: insulator, 280: insulator, 282: insulator, 283: insulator, 284: insulator, 287: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 430c: oxide, 431a: oxide, 431b: oxide, 432a: oxide, 432b: oxide, 442a: conductor, 442b: conductor, 443a: oxide, 443b: oxide, 450: insulator, 460: conductor, 460a: conductor, 460b: conductor, 535: back gate, 610: package substrate, 611: package substrate, 620: cover glass, 621: lens cover, 630: adhesive, 635: lens, 640: bump, 641: land, 650: image sensor chip, 651: image sensor chip, 660: electrode pad, 661: electrode pad, 670: wire, 671: wire, 690: IC chip, 911: housing, 912: display portion, 913: speaker, 919: camera, 932: display portion, 933: housing also serving as wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera, 1001: wiring, 1002: wiring, 1003: wiring, 1004: wiring, 1005: wiring, 1006: wiring, 1007: wiring, 1008: wiring, 1009: wiring, 1010: wiring, 3100: semiconductor device, 3300: memory device, 3311: peripheral circuit, 3321: row decoder, 3322: word line driver circuit, 3330: bit line driver circuit, 3331: column decoder, 3332: precharge circuit, 3333: amplifier circuit, 3334: input/output circuit, 3340: output circuit, 3360: control logic circuit, 3401: cell array, 3411: memory cell, 3411A: memory cell, 3411B: memory cell, 3411C: memory cell, 3411D: memory cell, 3420: memory cell, 3430: memory cell

The invention claimed is:

1. An imaging device comprising a first layer, a second layer, and a third layer,
   wherein the second layer is provided between the first layer and the third layer,
   wherein the first layer comprises a photoelectric conversion device,
   wherein the second layer comprises a first circuit and a second circuit,
   wherein the third layer comprises a third circuit and a fourth circuit,
   wherein the first circuit and the photoelectric conversion device are configured to generate imaging data,
   wherein the third circuit is configured to read the imaging data,
   wherein the second circuit is configured to store the imaging data read by the third circuit,
   wherein the fourth circuit is configured to read the imaging data stored in the second circuit,
   wherein the second circuit comprises a first transistor and a first capacitor,
   wherein one of a source and a drain of the first transistor is electrically connected to one electrode of the first capacitor,
   wherein the other of the source and the drain of the first transistor is electrically connected to the third circuit,
   wherein the other of the source and the drain of the first transistor is electrically connected to the fourth circuit, and
   wherein the first transistor comprises a metal oxide in a channel formation region.

2. The imaging device according to claim 1,
   wherein the third circuit comprises an A/D converter, and
   wherein the fourth circuit comprises a sense amplifier.

3. The imaging device according to claim 1,
   wherein the first layer and the third layer comprise single crystal silicon.

4. The imaging device according to claim 1,
wherein the metal oxide comprises In, Zn, and M, and
wherein M is one of Al, Ti, Ga, Ge, Sn, Y, Zr, La, Ce, Nd, and Hf.

5. An electronic device comprising the imaging device according to claim 1 and a display portion.

6. An imaging device comprising a first layer, a second layer, and a third layer,
wherein the second layer is provided between the first layer and the third layer,
wherein the first layer comprises a photoelectric conversion device,
wherein the second layer comprises a first circuit and a second circuit,
wherein the third layer comprises a third circuit and a fourth circuit,
wherein the first circuit and the photoelectric conversion device are configured to generate imaging data,
wherein the third circuit is configured to read the imaging data,
wherein the second circuit is configured to store the imaging data read by the third circuit,
wherein the fourth circuit is configured to read the imaging data stored in the second circuit,
wherein the first circuit comprises a first transistor, a second transistor, a third transistor, a fourth transistor, and a first capacitor,
wherein one electrode of the photoelectric conversion device is electrically connected to one of a source and a drain of the first transistor,
wherein the other of the source and the drain of the first transistor is electrically connected to one of a source and a drain of the second transistor,
wherein the one of the source and the drain of the second transistor is electrically connected to one electrode of the first capacitor,
wherein the one electrode of the first capacitor is electrically connected to a gate of the third transistor,
wherein one of a source and a drain of the third transistor is electrically connected to one of a source and a drain of the fourth transistor,
wherein the other of the source and the drain of the fourth transistor is electrically connected to the third circuit,
wherein the second circuit comprises a fifth transistor and a second capacitor,
wherein one of a source and a drain of the fifth transistor is electrically connected to one electrode of the second capacitor,
wherein the other of the source and the drain of the fifth transistor is electrically connected to the third circuit,
wherein the other of the source and the drain of the fifth transistor is electrically connected to the fourth circuit, and
wherein at least one of the first to fifth transistors comprises a metal oxide in a channel formation region.

7. The imaging device according to claim 6,
wherein the third circuit comprises an A/D converter, and
wherein the fourth circuit comprises a sense amplifier.

8. The imaging device according to claim 6,
wherein the first layer and the third layer comprise single crystal silicon.

9. The imaging device according to claim 6,
wherein the metal oxide comprises In, Zn, and M, and
wherein M is one of Al, Ti, Ga, Ge, Sn, Y, Zr, La, Ce, Nd, and Hf.

10. An electronic device comprising the imaging device according to claim 6 and a display portion.

* * * * *